US011410948B2

(12) United States Patent
Chen et al.

(10) Patent No.: US 11,410,948 B2
(45) Date of Patent: Aug. 9, 2022

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Hsien-Wei Chen, Hsinchu (TW); Jie Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/919,068

(22) Filed: Jul. 1, 2020

(65) Prior Publication Data

US 2021/0091022 A1 Mar. 25, 2021

Related U.S. Application Data

(60) Provisional application No. 62/905,412, filed on Sep. 25, 2019.

(51) Int. Cl.
*H01L 23/31* (2006.01)
*H01L 21/26* (2006.01)
*H01L 23/00* (2006.01)
*H01L 21/56* (2006.01)

(52) U.S. Cl.
CPC .............. *H01L 24/05* (2013.01); *H01L 21/56* (2013.01); *H01L 23/3121* (2013.01); *H01L 24/03* (2013.01); *H01L 24/29* (2013.01); *H01L 2224/02371* (2013.01); *H01L 2924/3511* (2013.01)

(58) Field of Classification Search
CPC ... H01L 2224/02371; H01L 2924/3511; H01L 24/03; H01L 23/3121
See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,437,538 | B2 * | 9/2016 | Pagaila .................. H01L 24/19 |
| 9,443,783 | B2 | 9/2016 | Lin et al. |
| 9,461,018 | B1 | 10/2016 | Tsai et al. |
| 9,496,189 | B2 | 11/2016 | Yu et al. |

(Continued)

*Primary Examiner* — Dale E Page
*Assistant Examiner* — Wilner Jean Baptiste
(74) *Attorney, Agent, or Firm* — JCIPRNET

(57) ABSTRACT

A semiconductor structure and a manufacturing method thereof are provided. The semiconductor structure includes an integrated circuit (IC) component, an insulating layer laterally encapsulating sidewalls of the IC component, a redistribution structure disposed on the insulating layer and the IC component, and a warpage control portion coupling to a back side of the IC component opposite to the redistribution structure. The redistribution structure is electrically connected to the IC component. The warpage control portion includes a substrate, a patterned dielectric layer disposed between the substrate and the IC component, and a metal pattern embedded in the patterned dielectric layer and electrically isolated from the IC component.

20 Claims, 18 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 9,922,964 B1 * | 3/2018 | Chen .................... H01L 25/105 |
| 2015/0171006 A1 * | 6/2015 | Hung .................. H01L 23/5384 |
| | | 257/774 |

* cited by examiner

SEMICONDUCTOR STRUCTURE AND MANUFACTURING METHOD THEREOF

CROSS-REFERENCE TO RELATED APPLICATION

This application claims the priority benefit of U.S. provisional application Ser. No. 62/905,412, filed on Sep. 25, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. Examples of the type of device packages for semiconductors include three-dimensional integrated circuits (3DICs). These relatively new types of packaging technologies for semiconductors face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
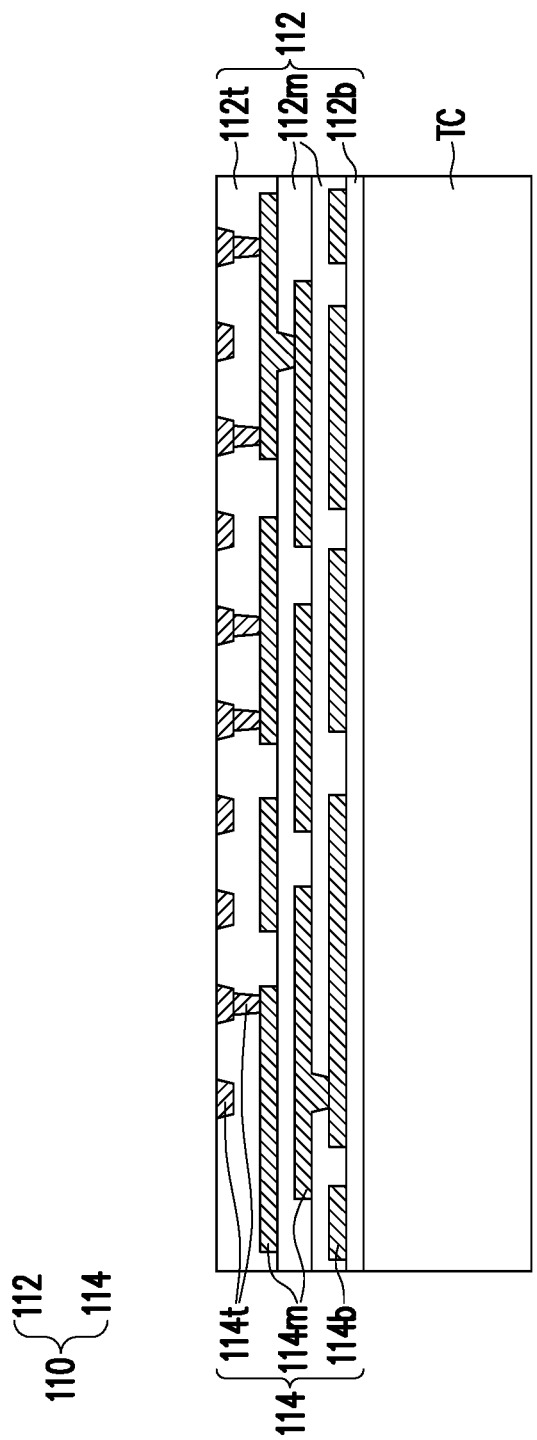
FIGS. 1A-1E illustrate schematic cross-sectional views of an integrated circuit (IC) portion at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming three-dimensional (3D) semiconductor structures. A 3D semiconductor structure includes an integrated circuit (IC) portion and a warpage control portion bonded to the IC portion. By the configuration of the warpage control portion, warpage of the 3D semiconductor structure may be effectively reduced. Some variations of embodiments are discussed. It should be appreciated that the illustration throughout the drawings are schematic and not in scale. Throughout the various views and illustrative embodiments, the identical or similar numbers refer to the identical or similar elements.

FIGS. 1A-1E illustrate schematic cross-sectional views of an integrated circuit (IC) portion at various stages of fabrication, in accordance with some embodiments. Referring to FIG. 1A, a redistribution structure 110 is formed over a temporary carrier TC. The temporary carrier TC may include any suitable material that provides mechanical support for the structure formed thereon in subsequent processing. Thereafter, the temporary carrier TC may be removed from the resulting structure once the manufacturing process is finished. For example, the temporary carrier TC includes glass, ceramic, metal, silicon, or the like. In some embodiments, the redistribution structure 110 is formed over the temporary carrier TC with an adhesive layer (not shown) interposed therebetween. For example, the adhesive layer is a light-to-heat conversion (LTHC) film which reduces or loses its adhesiveness when exposed to a radiation source (e.g., ultra-violet light, or a laser). Therefore, to remove the temporary carrier TC in subsequent processing, ultra-violet (UV) light or external energy may be applied to the adhesive layer to easily remove the temporary carrier TC and the adhesive layer from the resulting structure. Other suitable adhesive layers, such as die attach film (DAF), may be used, and the removal process of the temporary carrier TC may include a mechanical peel-off process, a grinding process, or an etching process, and may include additional cleaning process. In other embodiments, the adhesive layer is omitted.

The redistribution structure 110 may include one or more conductive features 114 (e.g., lines, vias, and pads) formed in one or more dielectric layers 112. The dielectric layers 112 of the redistribution structure 110 may include silicon oxide, silicon nitride, low-k dielectrics such as carbon doped oxides, extremely low-k dielectrics such as porous carbon doped silicon dioxide, combinations of these, or the like, and may be formed through a process such as chemical vapor deposition (CVD), plasma-enhanced chemical vapor deposition (PECVD), atomic layer deposition (ALD), or any other suitable deposition method. The conductive features 114 of the redistribution structure 110 may be formed of a metal such as aluminum, copper, tungsten, titanium, alloy, or combinations thereof, and may be formed by patterning and metallization techniques, or other suitable deposition methods.

In some embodiments, a bottommost dielectric layer 112b is deposited over the temporary carrier TC, and then a bottommost layer 114b of the conductive feature 114 is deposited on the bottommost dielectric layer 112b. Next, a middle dielectric layer 112m is formed on the bottommost dielectric layer 112b to cover the bottommost layer of the conductive feature 114, where a portion of the bottommost layer 114b of the conductive feature 114 is accessibly revealed by the openings of the middle dielectric layer 112m. The middle layer 114m of the conductive feature 114 is then formed in the openings of the middle dielectric layer 112m and extending to the top surface of the middle dielectric layer 112m. The steps of forming the middle dielectric layer 112m and the middle layer 114m of the conductive feature 114 may be repeated based on circuit design requirements.

Subsequently, a topmost dielectric layer 112t is formed on the middle dielectric layer 112m to cover the middle layer 114m of the conductive feature 114, and then a topmost layer 114t of the conductive feature 114 is formed in the openings of the topmost dielectric layer 112t. The topmost layer 114t of the conductive feature 114 may be formed through damascene process (e.g., single damascene or dual damascene), or other suitable process. In some embodiments, the topmost layer 114t of the conductive feature 114 functions as bonding connectors, and the topmost dielectric layer 112t functions as bonding dielectric. For example, at least a portion of the topmost layer 114t of the conductive feature 114 is in physical and electrical contact with the middle layer 114m of the conductive feature 114. In some embodiments, a portion of the topmost layer 114t of the conductive feature 114 is dummy connectors and may be electrically floating. In some embodiments, the topmost layer 114t of the conductive feature 114 and the topmost dielectric layer 112t are used to bond the semiconductor die(s) together in a hybrid bonding process.

Figure 1B:
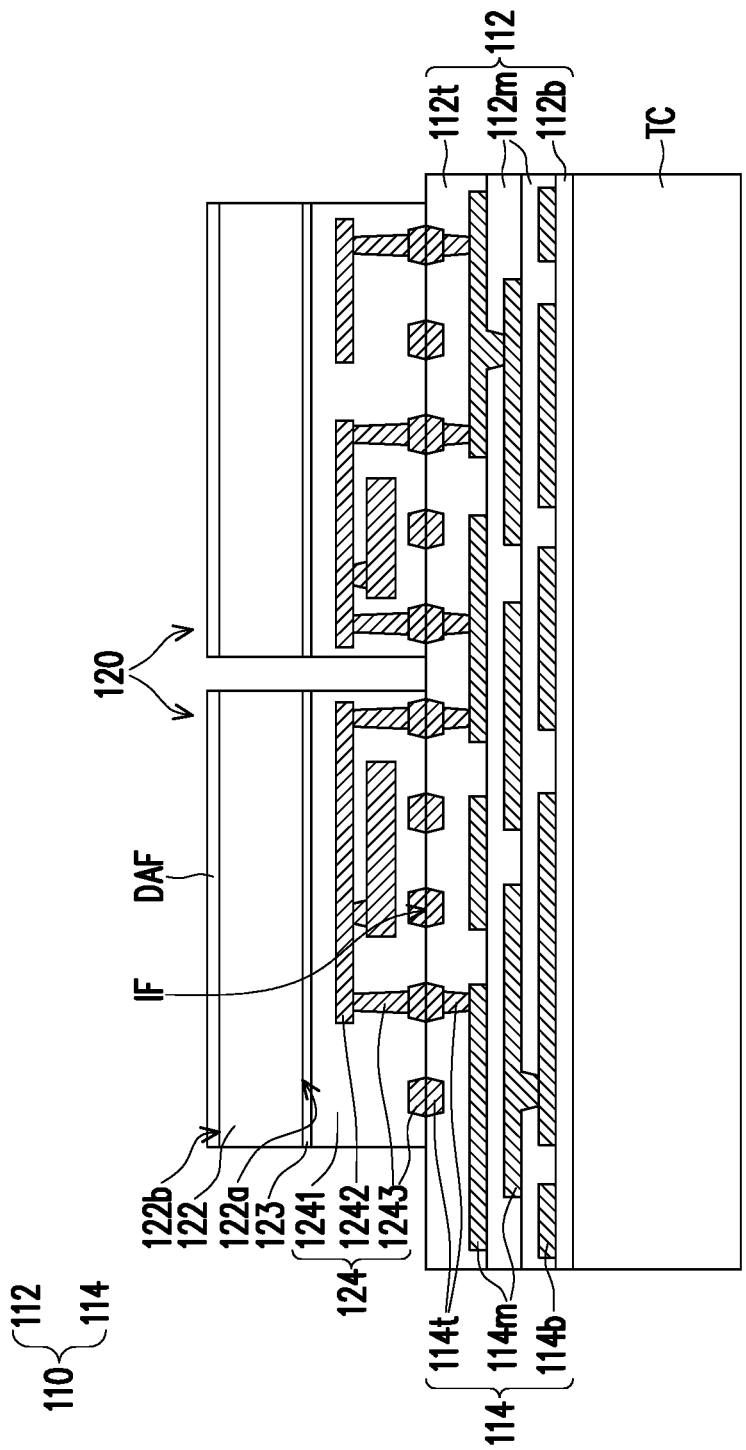

Referring to FIG. 1B, a plurality of integrated circuit (IC) components 120 are bonded to the redistribution structure 110. It should be noted that although two IC components 120 are illustrated, the number of the IC component 120 is not limited in the disclosure. The types of the IC components 120 may be the same or may be different. For example, the respective IC component 120 includes logic circuits, processing circuits, memory circuits, bias circuits, reference circuits, and/or the like. In some embodiments, the IC component 120 is referred to as a die or a chip that are singulated from a device wafer.

In some embodiments, each IC component 120 includes a semiconductor substrate 122 and an interconnect structure 124 formed on the semiconductor substrate 122. The semiconductor substrate 122 may include circuitries (not shown) formed in a front-end-of-line (FEOL), and the interconnect structure 124 may be formed in a back-end-of-line (BEOL). In some embodiments, the interconnect structure 124 includes an inter-layer dielectric (ILD) layer formed over the semiconductor substrate 122, and an inter-metallization dielectric (IMD) layer formed over the ILD layer. In some embodiments, the ILD layer and the IMD layer are formed of a low-K dielectric material, such as phosphosilicate glass (PSG), borophosphosilicate glass (BPSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

For example, the semiconductor substrate 122 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 122 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained.

In some embodiments, a die attach film DAF is disposed on the back side 122b of the semiconductor substrate 122. For example, the die attach film DAF is provided before the IC component 120 is bonded to the redistribution structure 110. Alternatively, the die attach film DAF is omitted. In some embodiments, a plurality of semiconductor devices 123, which is symbolized by a block, is formed on the front side 122a of the semiconductor substrate 122, and the interconnect structure 124 may interconnect the semiconductor devices 123. For example, the semiconductor devices 123 may be or may include active devices (e.g., transistors, diodes, etc.) and/or passive devices (e.g., capacitors, resistors, inductors, etc.), or other suitable electrical components. For example, the interconnect structure 124 includes a dielectric layer 1241 formed over the semiconductor substrate 122, and an interconnecting circuitry 1242 embedded in the dielectric layer 1241. The interconnecting circuitry 1242 may include conductive lines, conductive pads, conductive vias, etc. A material of the interconnecting circuitry 1242 may include copper or copper alloys, although other conductive materials (e.g., aluminum, silver, gold, and combinations thereof) may also be used. In some embodiments, two or more layers of conductive lines of the interconnecting circuitry 1242 are vertically interconnected by conductive vias of the interconnecting circuitry 1242. The interconnecting circuitry 1242 embedded in the dielectric layer 1241 may be electrically coupled to the semiconductor devices 123 formed in and/or on the semiconductor substrate 122.

In some embodiments, the interconnect structure 124 includes bonding connectors 1243 embedded in the dielectric layer 1241. For example, the bonding connectors 1243 are formed using a damascene process (e.g., single damascene or dual damascene) or other suitable techniques. In some embodiments, a portion of the dielectric layer 1241 where the bonding connectors 1243 are buried functions as bonding dielectric. The bonding surface of the dielectric layer 1241 may be substantially leveled with the bonding surfaces of the bonding connectors 1243. For example, at least a portion of the bonding connectors 1243 is in physical and electrical contact with the interconnecting circuitry 1242. In some embodiments, a portion of the bonding connectors 1243 is dummy connectors and may be electrically floating. In some embodiments, the interconnect structure 124 of the IC component 120 is in physical and electrical contact with the redistribution structure 110. For example, bonding of the IC component 120 to the redistribution structure 110 is achieved through the joint bonding mechanisms of the dielectric layer 1241 and the topmost dielectric layer 112t being bonding together, and also the respective bonding connectors 1243 and the topmost layer 114t of the conductive feature 114 being aligned and bonded together. In some embodiments, the bonding connector 1243 is in direct contact with the topmost layer 114t of the conductive feature 114, where the contact area of the bonding connector 1243 at the bonding interface IF of the topmost layer 114t of the conductive feature 114 and the bonding connector 1243 is substantially equal to the surface area of the topmost layer 114t of the conductive feature 114. For example, the contact area of the bonding connector 1243 and the contact area of the topmost layer 114t of the conductive feature 114 are substantially aligned at the bonding interface IF.

In some embodiments in which the dielectric layer 1241 and the topmost dielectric layer 112t are both oxide materials, an oxide-oxide bond is formed between the dielectric layer 1241 and the topmost dielectric layer 112t. In embodiments wherein the bonding connectors 1243 and 114t are both formed of copper, the copper in the bonding connectors (1243 and 114t) forms a copper-copper bond. Thus, the IC component 120 and the redistribution structure 110 are hybrid bonded by the bonding connectors 1243 disposed in the uppermost part of the interconnect structure 124 of the IC component 120 and the topmost layer 114t of the conductive feature 114 of the redistribution structure 110. For example, at least a portion of connections of the bonding connectors (1243 and 114t) provides vertical electrical connections between the IC component 120 and the redistribution structure 110. In some embodiments, the bonding may be performed at a die-to-wafer level. Alternatively, the bonding may be at wafer level, where the redistribution structure 110 and the IC component 120 are in a wafer form and bonded together, and then the bonded structure is singulated into separated packages.

Figure 1C:
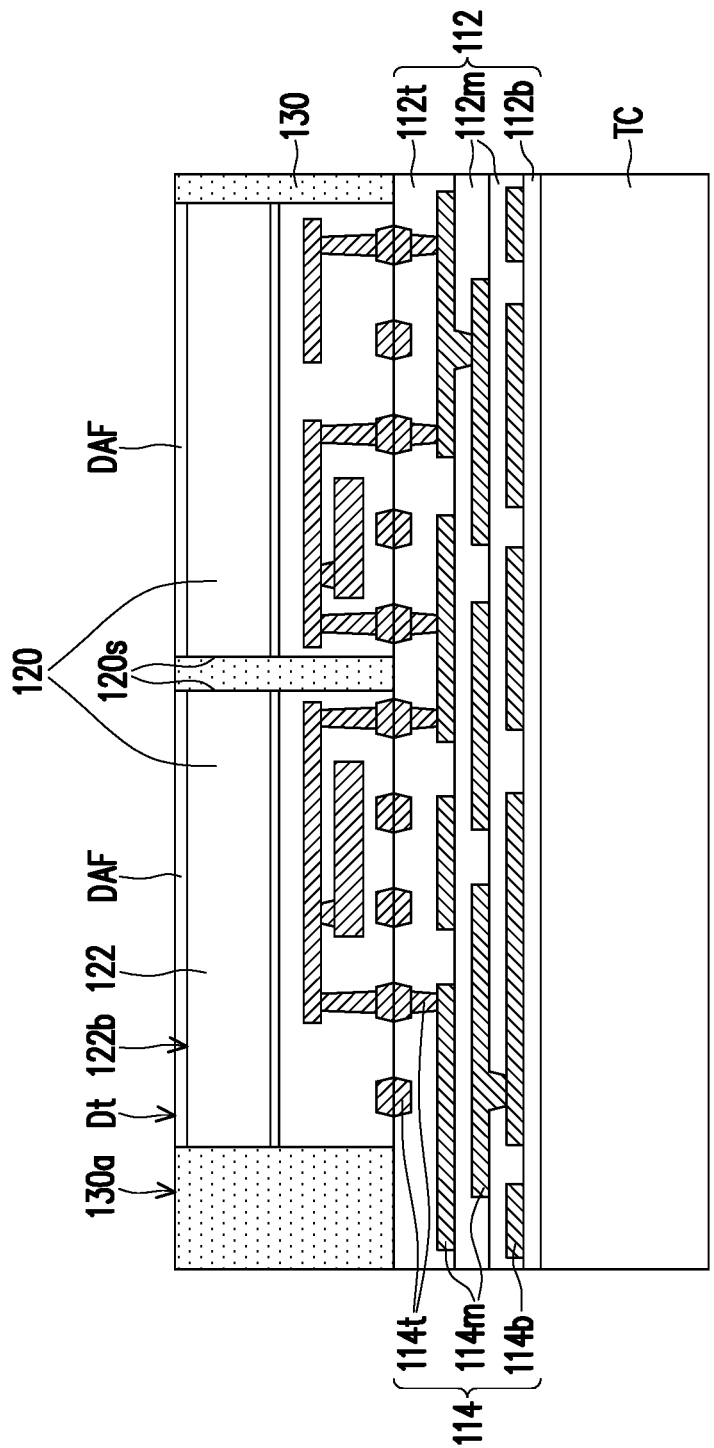

Referring to FIG. 1C, an insulating layer 130 is formed on the redistribution structure 110 to at least laterally cover the IC components 120. For example, the insulating layer 130 is formed on the topmost dielectric layer 112t of the redistribution structure 110 and extends along the sidewalls 120s of the IC components 120. The adjacent IC components 120 may fill the gap between adjacent IC components 120 and may be spatially separated from one another by the insulating layer 130. In some embodiments, the insulating layer 130 may include silicon oxide, silicon nitride, and/or tetraethoxysilane (TEOS). In some embodiments, the insulating layer 130 may be formed through CVD, PECVD, ALD, or the like. In some embodiments, the insulating layer 130 may be referred to as "gap fill oxide". In some other embodiments, the insulating layer 130 includes a molding compound, a molding underfill, a resin (such as epoxy), or the like. Other suitable insulating material that can provide a degree of protection for the IC components 120 may be used.

In some embodiments, a chemical mechanical polishing (CMP) step may next be employed to planarize the top surface 130a of the insulating layer 130. In some embodiments, the die attach films DAF disposed on the back sides 122b of the semiconductor substrates 122 are at least laterally covered by the insulating layer 130. For example, the top surface 130a of the insulating layer 130 is substantially leveled with the top surfaces Dt of the die attach films DAF. In some embodiments, a bonding layer (15; as shown in FIG. 4) is optionally formed over the IC components 120 and the insulating layer 130. In some embodiments, the bonding layer is in physical contact with the top surface 130a of the insulating layer 130 and the top surfaces Dt of the die attach films DAF. Alternatively, the die attach films DAF are omitted, and the top surface 130a of the insulating layer 130 may be substantially leveled with the back sides 122b of the semiconductor substrates 122.

Figure 1D:
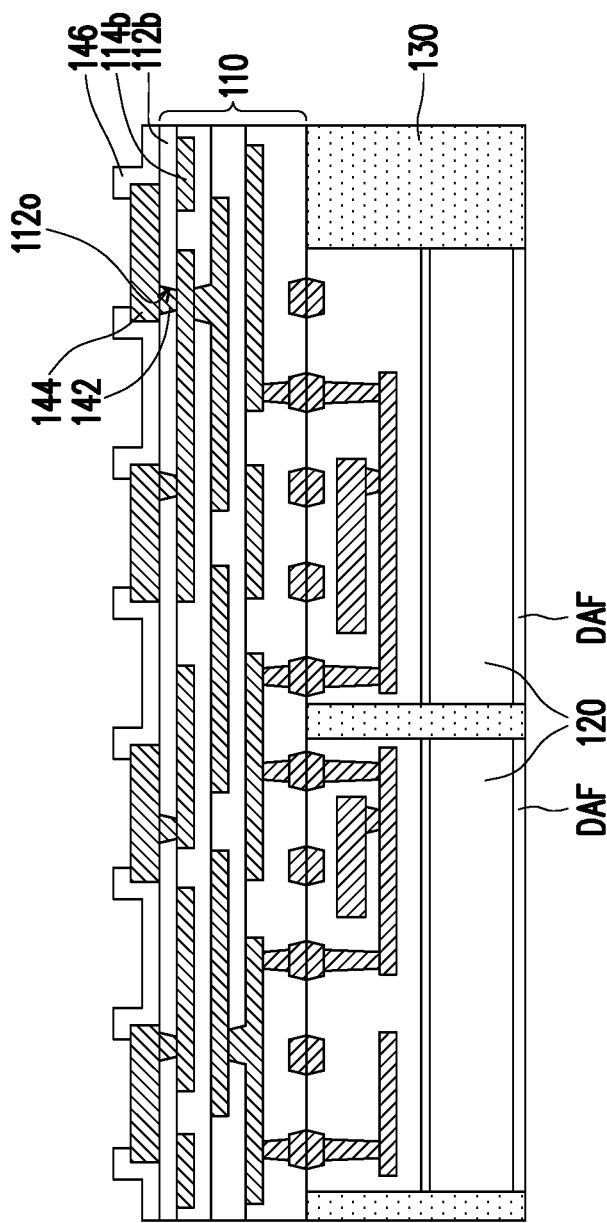
Figure 1E:
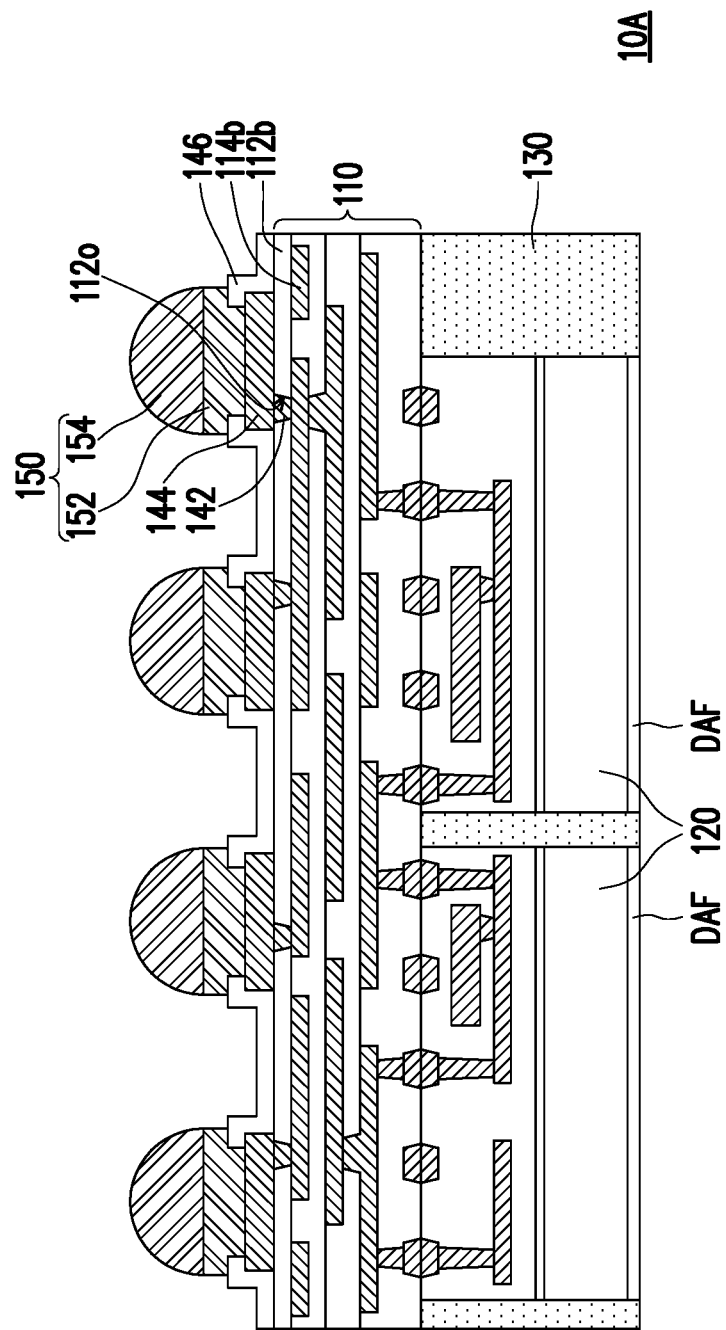

Referring to FIGS. 1D and 1E, the temporary carrier TC is removed to reveal the bottommost dielectric layer 112b of the redistribution structure 110, and then electrical connections are formed on the redistribution structure 110 opposite to the IC components 120. For example, a portion of the bottommost dielectric layer 112b is removed to form openings 112o by using lithography and etching techniques or other suitable removal process. The openings 112o of the bottommost dielectric layer 112b may accessibly expose at least a portion of the bottommost layer 114b of the conductive feature 114. Next, conductive materials may be formed in the openings 112o of the bottommost dielectric layer 112b and patterned on the surface of the bottommost dielectric layer 112b, so that through vias 142 in the openings 112o of the bottommost dielectric layer 112b and contact pads 144 on the surface of the bottommost dielectric layer 112b are formed. For example, the contact pads 144 and the through vias 142 connected to the contact pads 144 are electrically connected to the bottommost dielectric layer 112b. In some embodiments, the contact pads 144 include under-bump metallurgy (UBM) pattern for further electrical connection.

In some embodiments, a passivation layer 146 is optionally formed on the bottommost dielectric layer 112b in order to provide a degree of protection for the underlying structures. The passivation layer 146 may be made of one or more suitable dielectric materials such as silicon oxide, silicon nitride, low-k dielectrics such as carbon doped oxides, extremely low-k dielectrics such as porous carbon doped silicon dioxide, combinations of these, or other suitable dielectric materials. The passivation layer 146 may be formed through a process such as CVD, although any suitable process may be utilized. For example, the passivation layer 146 includes openings accessibly revealing at least a portion of the contact pads 144.

Subsequently, a plurality of conductive terminals 150 are formed in the openings of the passivation layer 146 and may be in physical and electrical contact with the contact pads 144 that are exposed by the passivation layer 146. In some embodiments, the respective conductive terminal 150 is a metal pillar 152 with a solder cap 154 formed thereon. In some embodiments, the conductive terminals 150 include controlled collapse chip connection (C4) bumps, and/or may include a material such as solder, tin, or other suitable materials (e.g., silver, lead-free tin, copper, etc.). Other terminal structures (e.g., ball grid array (BGA) balls, microbumps, and/or the like) may be used. Up to here, the IC portion 10A of the semiconductor structure is fabricated. The above examples are provided for illustrative purposes only, and other embodiments may utilize fewer or additional elements in the IC portion.

Figure 2B:
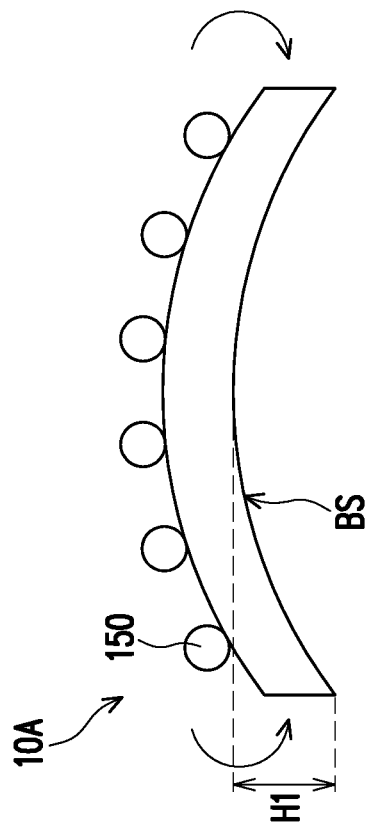
FIGS. 2A-2B illustrate schematic warpage profiles of an IC portion in accordance with some embodiments.
Figure 2A:
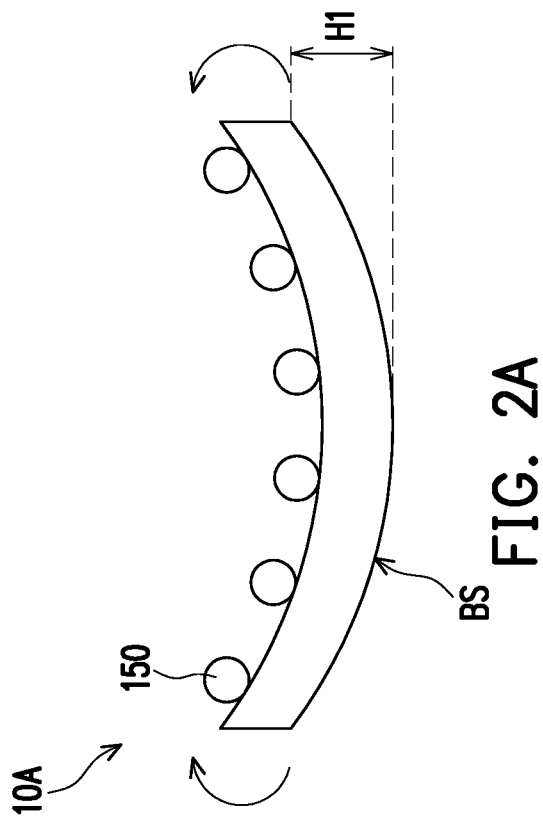
Figure 3B:
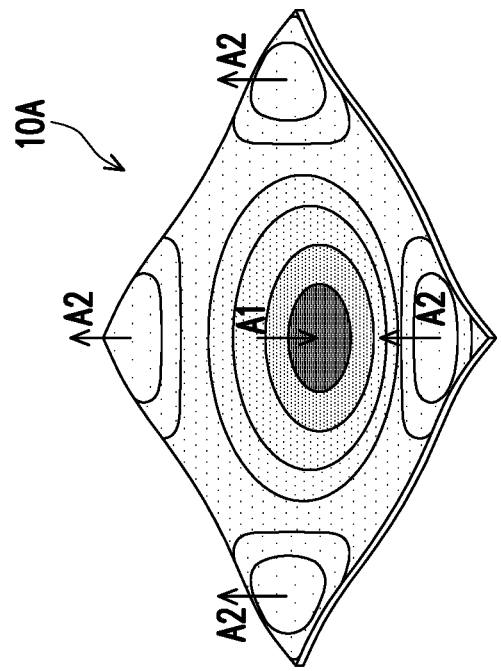
FIGS. 3A-3B illustrate schematic contour diagrams of an IC portion in accordance with some embodiments.
Figure 3A:
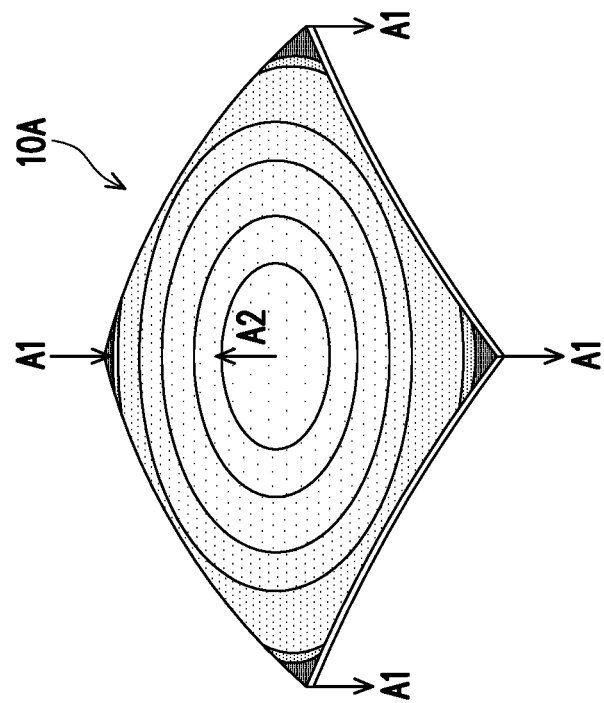

FIGS. 2A-2B illustrate schematic warpage profiles of an IC portion in accordance with some embodiments, and FIGS. 3A-3B illustrate schematic contour diagrams of an IC portion in accordance with some embodiments. For illustration purposes, the warpage profiles of the IC portion may be schematic and exaggerated throughout the drawings and the details of the IC portion are not illustrated. Referring to FIGS. 2A-2B and FIG. 1E, as a result of the manufacturing process, warping of the IC portion 10A shown in FIG. 1E may occur. For example, warpage occurs due to mismatch of the coefficients of thermal expansion (CTE) between materials, application of heat, temperature fluctuations, and/or the like. It is understood that the warpage of structure may adversely impact the electrical performance of the devices/circuits formed in the IC portion 10A, and the warpage issue may affect subsequent processing and/or product reliability.

The bowing of the IC portion 10A causes a bonding surface BS (e.g., the surface opposite to the conductive terminals 150) to be on a curved plane. In some embodiments, the IC portion 10A has a concave warpage (i.e. smiling profile), where the bonding surface BS of the IC portion 10A bows upwards as illustrated in FIG. 2A. In some other embodiments, the IC portion 10A has a convex warpage (i.e. crying profile), where the bonding surface BS of the IC portion 10A bows downwards as illustrated in FIG. 2B. In some embodiments, a height difference H1 in the bonding surface BS of the IC portion 10A at a high temperature (e.g., joint temperature about 250 degrees Celsius) may be about 80 µm or less than 80 µm. In the examples described above, the warpage of the IC portion may be symmetrical. Due to a complicated semiconductor processing, the IC portion 10A may present more complex warpages rather than simple convex or simple concave warpages.

Referring to FIGS. 3A-3B, in some embodiments, some regions of the IC portion 10A present a convex warpage and some other regions of the IC portion 10A present a concave warpage, where a portion of the bonding surface BS may bow upwards and another portion of the bonding surface BS may bow downwards. In some embodiments, the IC portion 10A may have asymmetric warpage. The various factors may result in warpage when the IC portion 10A is at room temperature (e.g., about 25 degrees Celsius) as well as when the IC portion 10A is exposed to high temperature (e.g., about 250 degrees Celsius or higher), as respectively shown in FIGS. 3A and 3B.

Figure 7B:
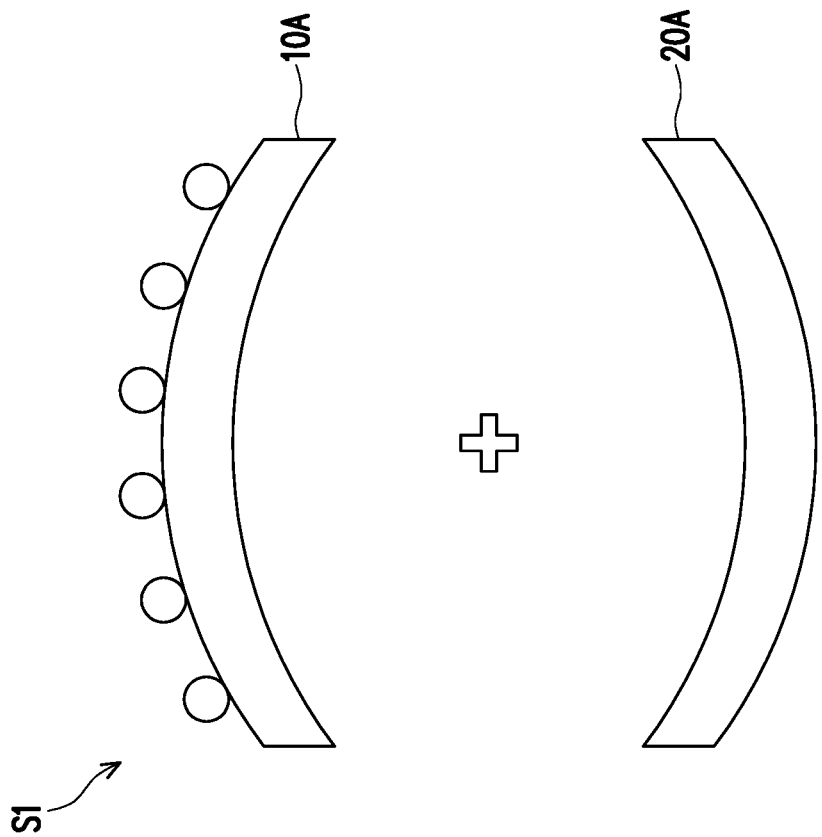
FIGS. 7A-7B illustrate schematic views of assembling of a semiconductor structure in accordance with some embodiments.

In some embodiments, at room temperature, an encountered warpage situation is such that the corner regions of the IC portion 10A bend downwardly as indicated by the arrows A1, while the center region of the IC portion 10A protrudes upwardly as indicated by the arrow A2. The warpage direction may change from the center region to the corner regions. In some embodiments, under a high temperature condition, the IC portion 10A may have an irregular warpage profile as illustrated in FIG. 7B. An encountered warpage situation may be such that the corner regions of the IC portion 10A bend upwardly as indicated by the arrows A2, while the center region of the IC portion 10A is recessed downwardly as indicated by the arrow A1.

Due to the curved plane of the IC portion 10A, it is difficult to bond all of the conductive terminals 150 to the respective contact pads of another package component (not shown), because some conductive terminals 150 would not contact the respective contact pads of package component. This may result in cold joints between the conductive terminals 150 and the contact pads of package component, and the cold joints result in defective semiconductor structure and reduce yields of the semiconductor manufacturing. In some embodiments, in order to reduce and/or eliminate warpage of the IC portion 10A, a warpage control portion is bonded to the IC portion 10A for warpage management. Details of which will be discussed hereinafter.

Figure 4A:
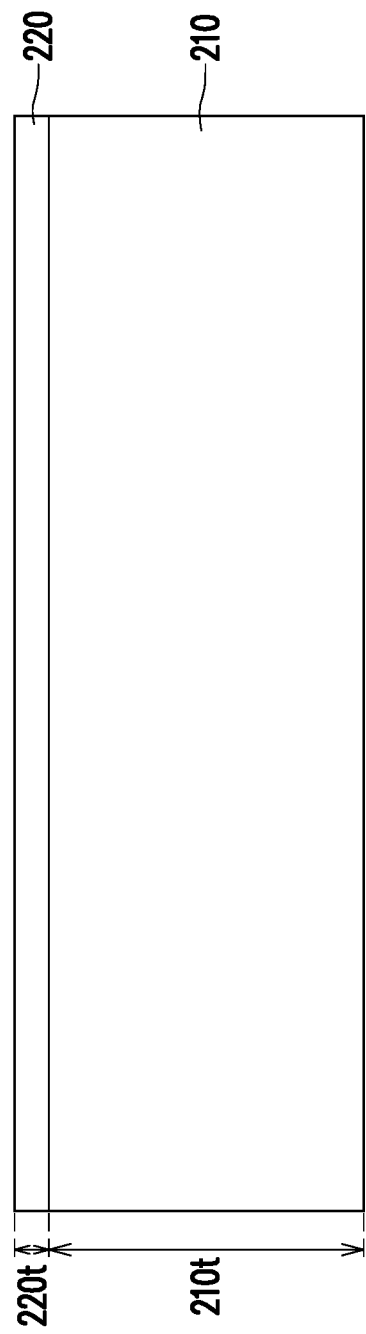
FIGS. 4A-4B illustrate schematic cross-sectional views of a warpage control portion at various stages of fabrication, in accordance with some embodiments.
Figure 4B:
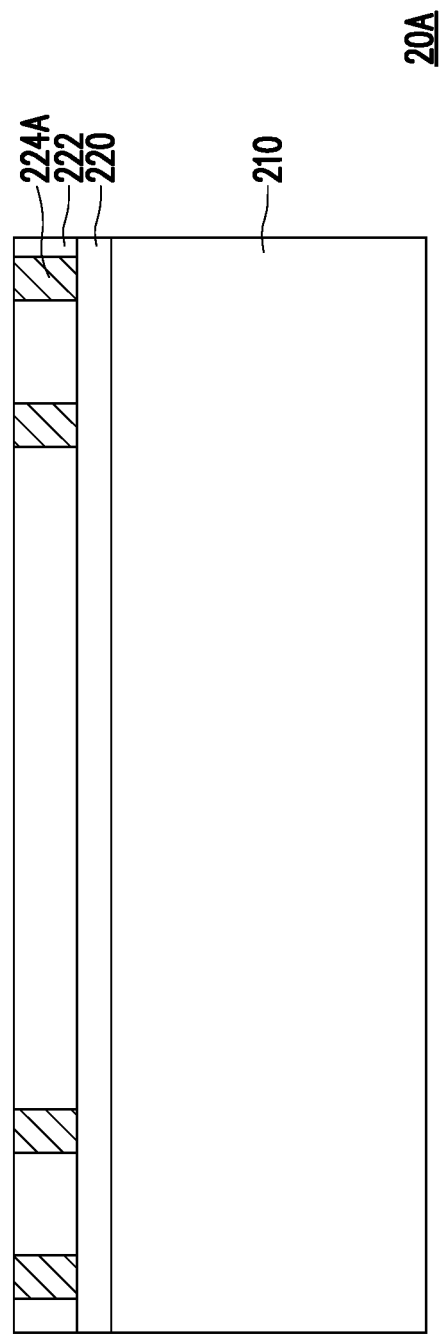

FIGS. 4A-4B illustrate schematic cross-sectional views of a warpage control portion at various stages of fabrication, in accordance with some embodiments. Referring to FIG. 4A, a first dielectric layer 220 is formed over a substrate 210. For example, the substrate 210 is a silicon substrate. In some embodiments, the substrate 210 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. In some embodiments, the substrate 210 is made of glass, ceramic, metal, or other suitable materials which have a certain degree of rigidity.

In some embodiments, the first dielectric layer 220 is an oxide layer. In some embodiments, the first dielectric layer 220 may be formed of non-organic materials such as silicon oxide, un-doped silicate glass, silicon oxynitride, and the like. Other suitable dielectric materials (e.g., polyimide, polybenzoxazole (PBO), benzocyclobutene (BCB), combinations of these, or the like) may also be used. For example, the interface between the substrate 210 and the first dielectric layer 220 may be silicon-to-silicon, silicon-to-oxide, oxide-to-oxide, or any other covalent bonding mechanism. The thickness 210t of the substrate 210 and the thickness 220t of the first dielectric layer 220 may be changed to control the warpage of the warpage control portion as will be explained later in other embodiments.

Referring to FIG. 4B, a second dielectric layer 222 and a metal pattern 224A which is embedded in the second dielectric layer 222 are formed on the first dielectric layer 220. In some embodiments, a dielectric material is formed by suitable fabrication techniques such as spin-on coating, CVD, PECVD, lamination, or other suitable deposition process, and then a portion of the dielectric material is removed to form the second dielectric layer 222 with openings by using lithography and/or etching, laser drilling, or other suitable removal process. The second dielectric layer 222 may be referred to as a patterned dielectric layer.

The first dielectric layer 220 and the second dielectric layer 222 may be made of one or more suitable dielectric materials such as silicon oxide, silicon nitride, low-k dielectrics such as carbon doped oxides, extremely low-k dielectrics such as porous carbon doped silicon dioxide, combinations of these, etc. In other embodiments, the first dielectric layer 220 and/or the second dielectric layer 222 may be made of a polymer such as polyimide, polybenzoxazole (PBO), benzocyclobutene (BCB), combinations of these, or the like. In some embodiments, the first dielectric layer 220 and the second dielectric layer 222 are both oxides, and an etch stop layer (not shown) is interposed therebetween.

Next, the metal pattern 224A may be formed in the openings of the second dielectric layer 222. For example, a seed layer is conformally formed on the second dielectric layer 222, and the conductive material (e.g., copper, copper alloy, aluminum, aluminum alloy, or combinations thereof) is filled in the openings using plating or other suitable process. A planarization process (e.g., a CMP, mechanical grinding, etc.) may be performed such that the top surface of the second dielectric layer 222 and the top surface of the metal pattern 224A are substantially level. In some embodiments, additional second dielectric layer 222 and additional metal pattern 224A may be repeatedly formed to control the warpage of the warpage control portion as will be described later in accompanying with FIGS. 9-10. The metal pattern 224A may include inclined sidewalls or vertical sidewalls, which depend on the process requirements. The specific configuration of the metal pattern 224A is based on the warpage characteristics of the IC portion to be bonded, and the details with respect to the configuration of the metal pattern 224A will be described later in other embodiments.

Figure 5:
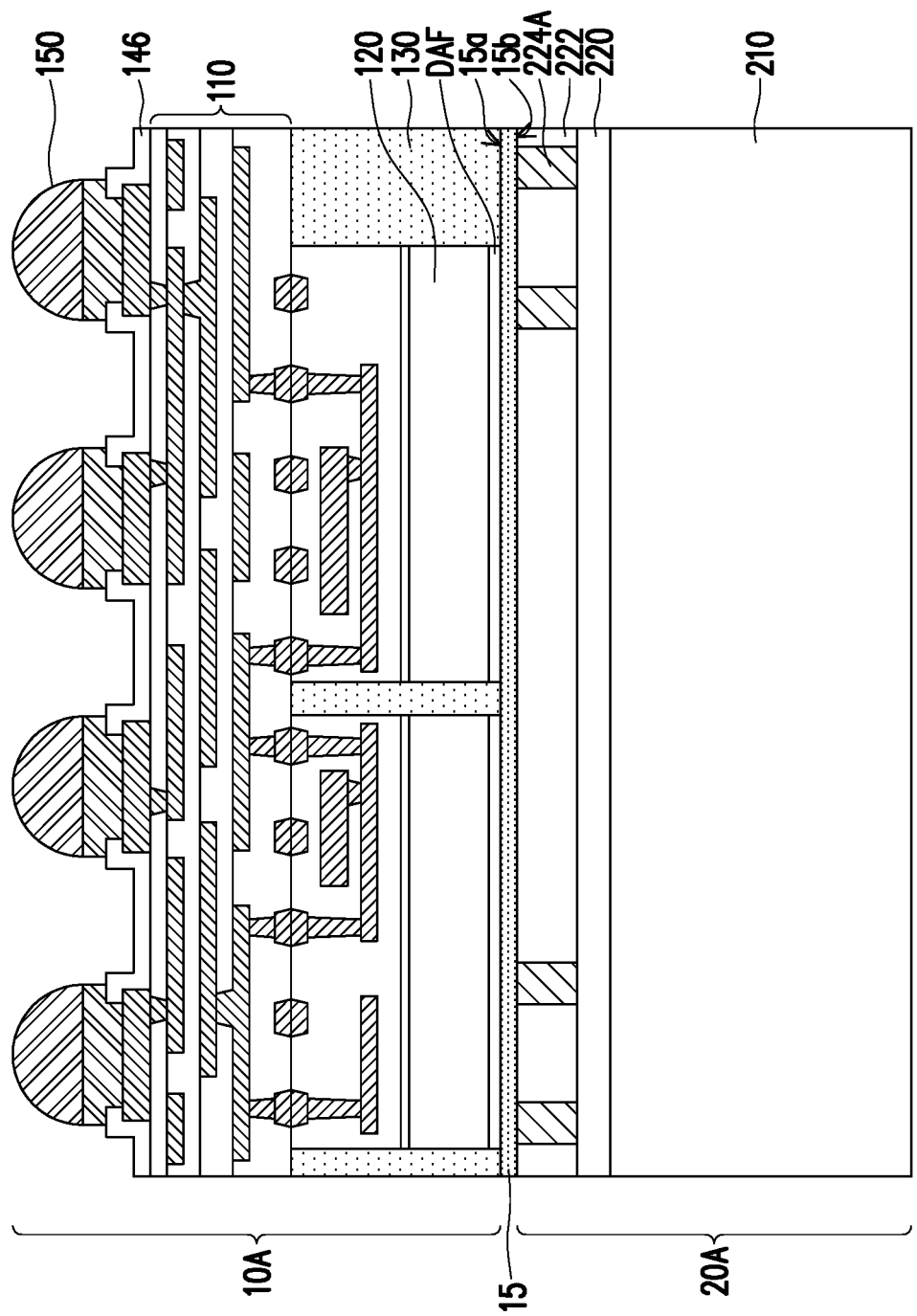
FIG. 5 illustrates a schematic cross-sectional view of a semiconductor structure including an IC portion and a warpage control portion in accordance with some embodiments.

In some embodiments, a bonding layer (15; as shown in FIG. 5) is optionally formed on the second dielectric layer 222 and the metal pattern 224A. For example, if the bonding layer is formed during fabricating the IC portion 10A, then the bonding layer may not be formed on the second dielectric layer 222 and the metal pattern 224A. If the bonding layer is absence in the IC portion 10A, then the forming process of the bonding layer is performed on the second dielectric layer 222 and the metal pattern 224A. In some embodiments, the bonding layers are formed both of in the IC portion 10A and the warpage control portion 20A. Up to here, the warpage control portion 20A of the semiconductor structure is fabricated.

FIG. 5 illustrates a schematic cross-sectional view of a semiconductor structure including an IC portion and a warpage control portion in accordance with some embodiments. Referring to FIG. 5, a semiconductor structure S1 including the IC portion 10A and the warpage control portion 20A stacked upon one another is provided. For example, the IC portion 10A and the warpage control portion 20A are bonded together by such as a thermal bonding process, a gluing process, a pressure bonding process, a combination thereof, or other types of bonding processes. In some embodiments, the IC portion 10A and the warpage control portion 20A are bonded together through a bonding layer 15 interposed therebetween. For example, the bonding layer 15 is an oxide based layer of dielectric to form an oxide-to-oxide bonding (oxide fusion bonding) to another portion in the subsequent process. An anneal process may be performed after the bonding process to increase bonding strength between the IC portion 10A and the warpage control portion 20A. In other embodiments, the bonding layer 15 is an adhesive layer or a glue layer for physical connection. For example, the bonding layer 15 includes a die attach film that may be made of epoxy resin, phenol resin, acrylic rubber, silica filler, combination thereof, or the like.

In some embodiments, the bottom surface 15b of the bonding layer 15 is in physical contact with the second dielectric layer 222 and the metal pattern 224A of the warpage control portion 20A. The metal pattern 224A of the warpage control portion 20A may be electrically isolated by the dielectric materials. For example, the sidewalls of the metal pattern 224A are covered by the second dielectric layer 222, the bottom surface of the metal pattern 224A is covered by the first dielectric layer 220, and the top surface of the metal pattern 224A is covered by the bonding layer 15. The metal pattern 224A of the warpage control portion 20A may be electrically floating in the semiconductor structure S1. The metal pattern 224A may be referred to as a dummy pattern or dummy conductive features. In some embodiments, the top surface 15a of the bonding layer 15 is connected to the IC portion 10A. For example, the insulating layer 130 and the die attach films DAF that are substantially leveled with the insulating layer 130 are in physical contact with the top surface 15a of the bonding layer 15. In some embodiments in which the die attach films DAF are omitted, the top surface 15a of the bonding layer 15 is in physical contact with the insulating layer 130 and the semiconductor substrate 122 of the IC component 120.

In some embodiments, bonding of the IC portion 10A and the warpage control portion 20A may be at wafer level, and after the bonding step, the resulting structure is singulated to form individual semiconductor structures S1. For example, the singulation involves cutting through successive layers, such as the passivation layer 146, the redistribution structure 110, the insulating layer 130, the bonding layer 15, the second dielectric layer 222, the first dielectric layer 220, and the substrate 210. Thus, after the singulation, the sidewalls of these successive layers may be substantially leveled with one another.

In some embodiments, one of the functions of the warpage control portion 20A is to control the warpage of the IC portion 10A. As mentioned above, the IC portion 10A may undergo warpage due to several factors (e.g., CTE mismatch, excessive thermal stress, temperature fluctuations, and/or the like). As is known, the warpage of the IC portion may adversely impact electrical performance. In addition, low planarity (or severely warped) of the IC portion may cause stress to packaged IC components and interferes with the singulation process. By attaching the warpage control portion 20A to the IC portion 10A, the warpage problem of the IC portion 10A may be solved. For example, the warpage control portion 20A bonded to the IC portion 10A has an inherent stress, which may cause the IC portion 10A to warp against the existing warpage direction, hence compensating for the existing warpage. In some embodiments, the warped IC portion 10A is to be flattened by bonding to the warpage control portion 20A before being sawed into individual semiconductor structures S1 to enable proper sawing and good package planarity.

Figure 6:
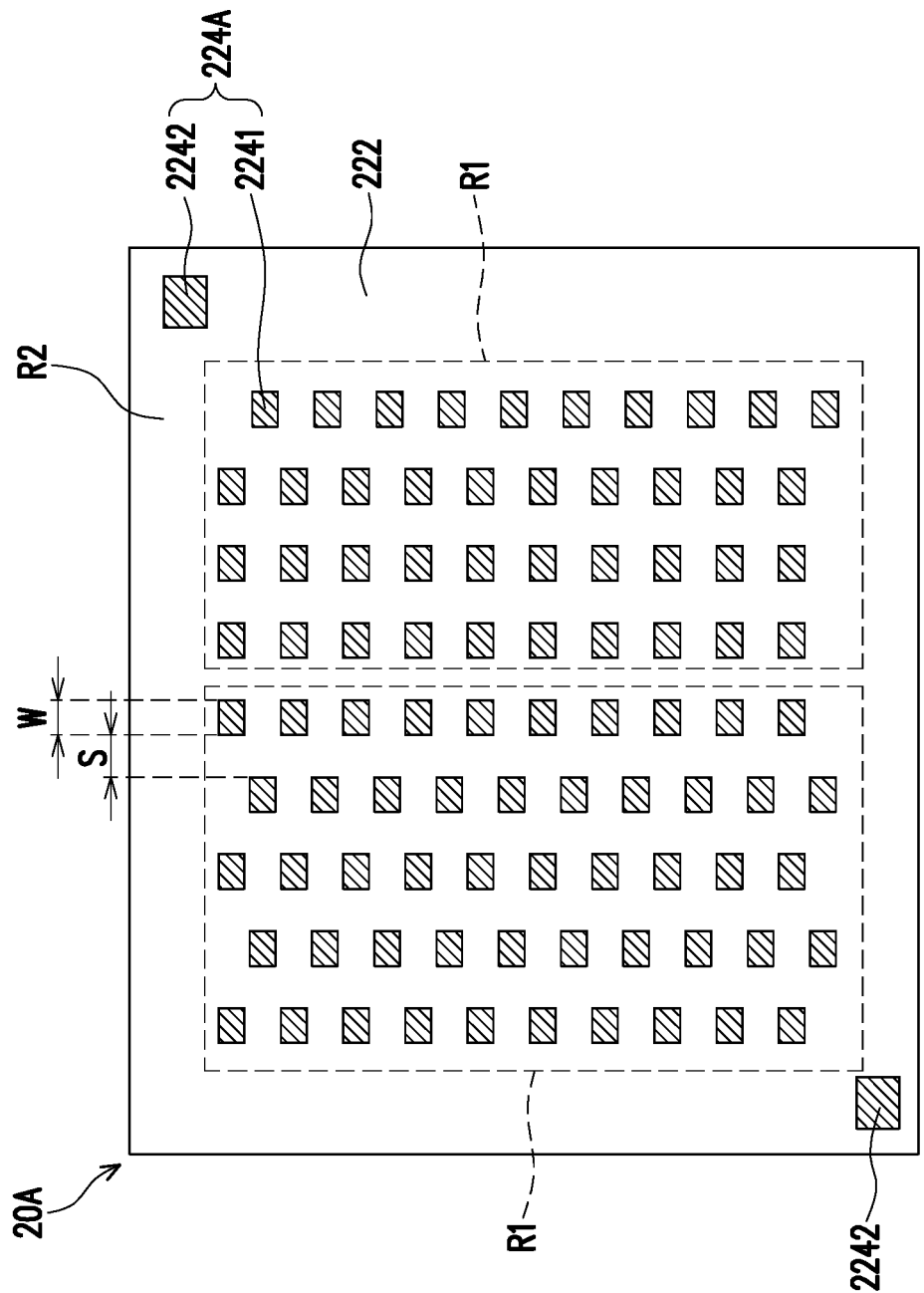
FIG. 6 illustrates a schematic top view of a warpage control portion in FIG. 5 in accordance with some embodiments.

FIG. 6 illustrates a schematic top view of a warpage control portion in FIG. 5 in accordance with some embodiments. Referring to FIGS. 5 and 6, the metal pattern 224A may include a plurality of first features 2241 formed in the openings of the second dielectric layer 222. For example, the first features 2241 are arranged in an array. In some embodiments, the first features 2241 are arranged in a linear array. Alternatively, the first features 2241 are arranged such as in a non-linear manner, a curvilinear manner, a geometric-sequence manner, or other uniform distribution manner. In other embodiments, the first features 2241 are arranged such as in a uniform distribution, in a random manner, or in otherwise irregular distribution.

Although the illustrated first features 2241 are all rectangular in shape in the top view, it is understood that the first features 2241 in other embodiments may have any shape, such as, circular, oval, triangular, square, cross, polygonal, combination of these, etc. In some embodiments, the first features 2241 include dummy metal vias, dummy metal lines, and/or dummy metal pads. The respective first feature 2241 may be spatially apart from one another. For example, the first features 2241 are not electrically connected and may be isolated from one another. In some embodiments, the metal lines of a certain line width W have a certain amount of spacing S between them. The first features 2241 may be designed with distributed lines and spaces so as to conform to design rules and provide the desired warpage effect and level. In some embodiments, the line width W of the respective first feature 2241 is about 15 μm or may be less than 15 μm. By way of example, the line width W is in a range of about 0.3 μm and about 15 μm. In some embodiments, the line spacing S of the adjacent first features 2241 is at least 0.3 μm or greater than 0.3 μm.

In some embodiments, the first features 2241 are formed in accordance with design rules where the spacing S between the metal lines is varied to achieve the desired global pattern density. For example, the global pattern density ranges from about 10% to about 80%. In some embodiments, the first features 2241 are laid out in a window in which the local pattern density is in a range of about 10% and about 90%. In some embodiments, a density difference between windows is substantially equal to or less than 40%, where the respective window may have a length and width of 250 μm by 250 μm. It is appreciated that the dimensions recited herein are merely examples, and may be changed if different formation technologies are used, or if simulations reveal that different dimensions are preferred.

The formation of the first features 2241 may increase or reduce stress by redistributing local stresses to specific region(s) of the warpage control portion 20A. For example, the first features 2241 are located in the region(s) selected to more effectively control warping of the IC portion 10A. In some embodiments, the warpage control portion 20A includes a first region R1 and a second region R2 surrounding the first region R1. The first features 2241 may be distributed within the first regions R1, and the first regions may correspond to the regions of the IC components 120 in the IC portion 10A. For example, the orthographic projection area of the respective IC component 120 may substantially overlap the corresponding first region R1. In other embodiments, the orthographic projection area of the IC component 120 partially overlaps the first region R1. Alternatively, the orthographic projection area of the IC component 120 is fully staggered from the first region R1. The distribution area of the first region R1 may be determined based on warpage profiles so as to counteract or compensate an undesirable warpage of the IC portion 10A. The details with respect to the warpage control will be described later in other embodiments.

In some embodiments, the metal pattern 224A includes at least one second feature 2242 disposed within the second region R2. For example, the second region R2 is a border region of the warpage control portion 20A in the top view. For example, the first features 2241 are limited to being in the first regions R1 that correspond to the IC components 120, and the second features 2242 in the second region R2 are located at the periphery of the warpage control portion 20A. The first features 2241 and the second features 2242 may not have electrical functions in the semiconductor structure S1 and may not be electrically connected to the overlying IC portion 10A. In some embodiments, the second features 2242 are formed of same conductive materials as that of the first features 2241, and the second features 2242 may be formed substantially concurrent with formation of the first features 2241. In some embodiments, a plurality of the second features 2242 is disposed in a diagonal arrangement in the second region R2. Other arrangement may be used to form the second features 2242.

In some embodiments, the second feature 2242 may function as an alignment mark so that the second feature 2242 may be referred to as the alignment feature. The second features 2242 may be formed into blank areas on the warpage control portion 20A inside scribed lines (not shown) so that after the singulation, the second features 2242 are remained in the warpage control portion 20A. In some embodiments, the second features 2242 may be formed in edge areas overlapping the scribed lines (not shown) so that the second features 2242 are cut through and partially remained in the warpage control portion 20A after the singulation. In other embodiments, the second features 2242 may be formed in areas outside the scribed lines (not shown) so that the second features 2242 are removed after the singulation. The second feature 2242 serving as the alignment mark may be of a geometrical shape (e.g., triangular, rectangular, square, cross, circular, oval, polygonal), or any suitable shape. The illustrated second features 2242 are not intended to be limiting as the second features 2242 may have any number, shape, or size. It is appreciated that the metal pattern 224A shown in FIGS. 5-6 is merely an example, and should not limit the scope of the present disclosure.

Figure 7A:
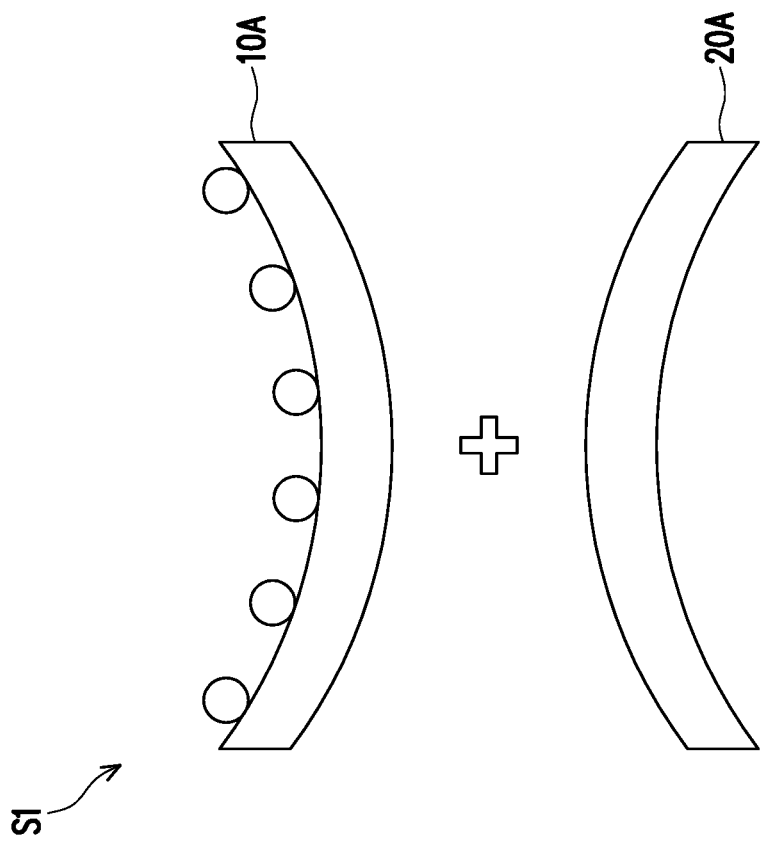

FIGS. 7A-7B illustrate schematic views of assembling of a semiconductor structure in accordance with some embodiments. It is noted that the degree of warpages shown in FIGS. 7A-7B is exaggerated, and the details of the IC portion are omitted for illustrative purposes. Referring to FIG. 7A, the semiconductor structure S1 includes the IC portion 10A and the warpage control portion 20A. In some embodiments, the IC portion 10A presents a concave warpage (i.e. smiling profile), and the warpage control portion 20A with the predetermined convex warpage (i.e. crying profile) may be fabricated to counteract an internal stress leading to concave warpage of the IC portion 10A, thereby reducing manufacturing defects.

In some embodiments, the warpage characteristics of the IC portion 10A are determined prior to bonding. For example, the height difference H1 in the bonding surface BS of the IC portion 10A (shown in FIGS. 2A-2B) is estimated through simulation or experiments. In some embodiments, the warpage simulation is performed based on the design of the IC portion 10A to generate a contour diagram of the warpage profile. By analyzing the warpage of the IC portion 10A, the configuration of the warpage control portion 20A may be estimated. For example, the pattern density, line width and spacing of the metal pattern of the warpage control portion 20A may depend on the warpage to be compensated for. In some embodiments, the warpage of the warpage control portion 20A may be achieved by forming the dielectric materials (e.g., the first dielectric layer 220 and/or the second dielectric layer 222 shown in FIG. 3B) on the substrate 210, with the dielectric materials having an inherent stress, which provides the desired warpage effect and level. In some embodiments, the thickness of the substrate 210 may be determined based on the warpage characteristics of the IC portion 10A to permit tuning of the warping control of the IC portion 10A.

Referring to FIG. 7B, the semiconductor structure S1 includes the IC portion 10A and the warpage control portion 20A. In some embodiments, the IC portion 10A presents a convex warpage (i.e. crying profile) and the warpage control portion 20A may have a concave warpage (i.e. smiling profile), so that the bonding of the IC portion 10A and the warpage control portion 20A may achieve the flatness requirements of the semiconductor structure. As discussed above, the configuration of the warpage control portion 20A may vary due to warpage profile. In some embodiments, the simulated warpage characteristics of the IC portion 10A are used to determine a desired warpage degree of the warpage control portion 20A that is used to bond the IC portion 10A.

For example, the metal pattern that fills the openings of the second dielectric layer may have the effect of inducing concave warpage. A greater pattern density of the metal pattern of the warpage control portion 20A may result in a greater warpage compensation effect. The pattern density may be referred to as a density of the first features occupying a region of the warpage control portion in the top view. The pattern density may be a ratio of the area occupied by the first features in the first regions with respect to the total area of the warpage control portion. The dielectric materials (e.g., the first dielectric layer 220 and/or the second dielectric layer 222 shown in FIG. 3B) formed on the substrate 210 may be selected to cause the concave warpage or the convex warpage of the warpage control portion 20A. In some embodiments, the dielectric materials of the warpage control portion 20A are selected to relieve the bending force provided by the metal pattern 222 of the warpage control portion 20A. In some embodiments, the warpage control portion 20A having thicker dielectric materials is prone to warpage resulting from the stress imposed by these dielectric materials. In some embodiments, thickness of the substrate 210 is changed to control the warpage of the warpage control portion 20A. For example, the thicker substrate 210 is used to reduce the concavity of the warpage control portion 20A.

In the examples described above, the warpage of the IC portion 10A may be symmetrical, and the warpage control portion 20A may also be symmetrical. In some embodiments, due to a complicated semiconductor processing, the IC portion 10A presents more complex warpage profiles. In such embodiments, the warped IC portion 10A may be simulated and analyzed. Based on the simulation results (e.g., three-dimensional contour diagrams shown in FIGS. 3A-3B), warpage compensation may be tailored to form the warpage control portion 20A having the specific configuration that corresponds to the warped IC portion. Accordingly, the warpage of the IC portion 10A is compensated by the preplanned internal stress of the warpage control portion 20A so as to prevent the warpage of semiconductor structure S1 as a whole.

Figure 8:
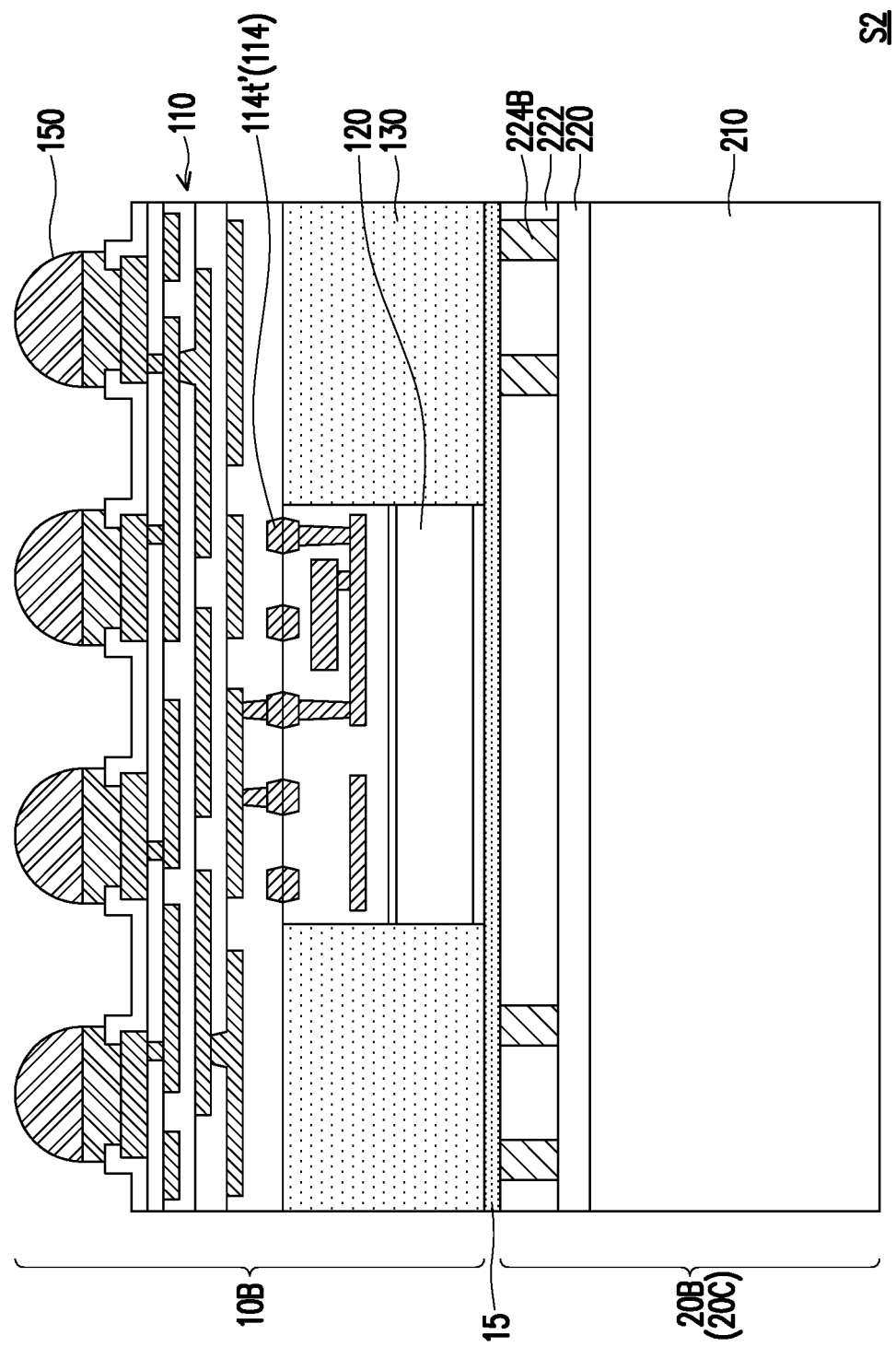
FIG. 8 illustrates a schematic cross-sectional view of a semiconductor structure including an IC portion and a warpage control portion in accordance with some embodiments.
Figure 9A:
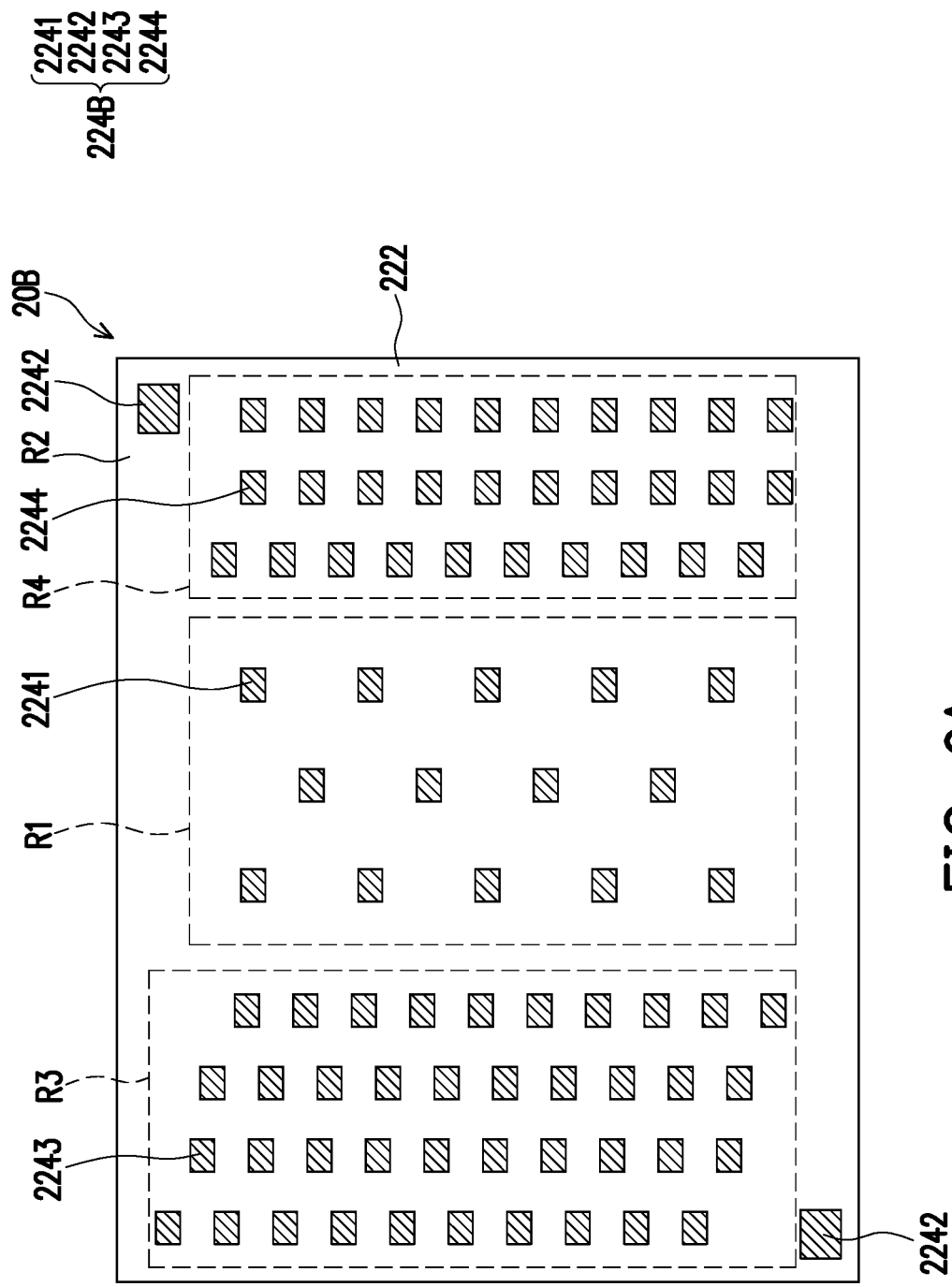
FIGS. 9A-9B illustrate schematic top views of a warpage control portion in FIG. 8 with different configurations in accordance with some embodiments.
Figure 9B:
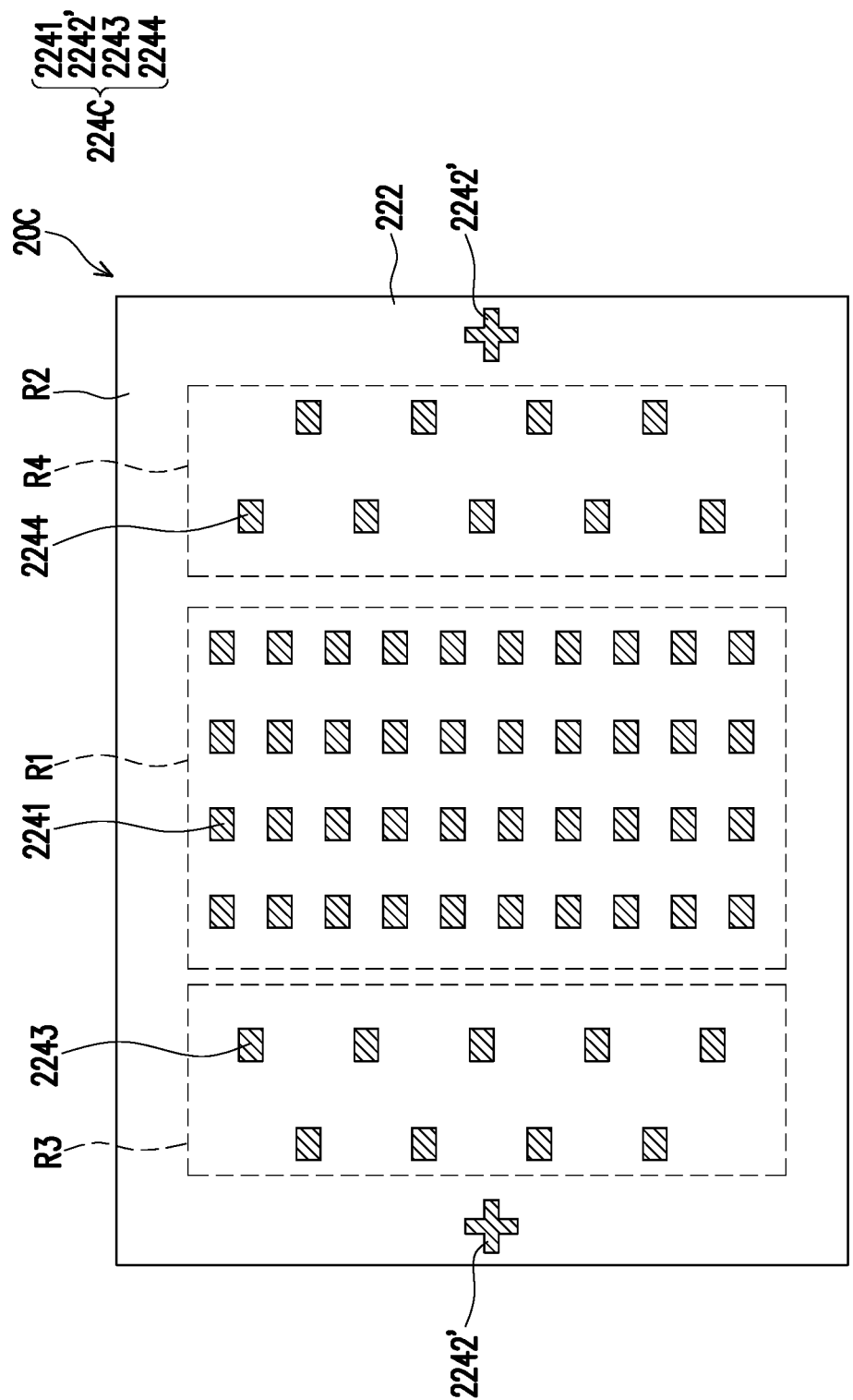

FIG. 8 illustrates a schematic cross-sectional view of a semiconductor structure including an IC portion and a warpage control portion in accordance with some embodiments and FIGS. 9A-9B illustrate schematic top views of a warpage control portion in FIG. 8 with different configurations in accordance with some embodiments. Throughout the various views and illustrative embodiments of the present disclosure, like reference numbers are used to designate like elements.

Referring to FIG. 8, a semiconductor structure S2 including the IC portion 10B and the warpage control portion 20B attached to the IC portion 10B. The semiconductor structure S2 may be similar to the semiconductor structure S1 described in FIG. 5. The differences between the semiconductor structures S1 and S2 include that a single IC component 120 is disposed therein, and the topmost layer 114t' of the conductive feature 114' of the redistribution structure 110' is correspondingly modified. Again, the number of the IC components 120 is not limited in the disclosure, and examples are provided for illustrative purposes only.

The warpage control portion 20B may be similar to the warpage control portion 20A of the semiconductor structure S1 described in FIG. 5, except that the configuration of the metal pattern 224B is modified. For example, referring to FIGS. 8 and 9A, the warpage control portion 20B includes the first region R1, a third region R3 and a fourth region R4 located at two opposite sides of the first region R1, and the second region R2 surrounding the first region R1, the third region R3, and the fourth region R4. The first features 2241 may be distributed within the first regions R1 that correspond to the region of the IC component 120 in the IC portion 10B.

The metal pattern 224B may further include a plurality of third features 2243 distributed within the third region R3, and a plurality of fourth features 2244 distributed within the fourth region R4. The third features 2243 and the fourth features 2244 may be generated by a rule-based procedure. In some embodiments, the pattern density of the first features 2241 in the first region R1 is sparser than the pattern density of the third features 2243 in the third region R3. In some embodiments, the pattern density of the first features 2241 in the first region R1 is also sparser than the pattern density of the fourth features 2244 in the fourth region R4. In some embodiments, the pattern densities of the third features 2243 and the fourth features 2244 are substantially the same. Alternatively, the pattern density of the third features 2243 in the third region R3 may be denser or sparser than that of the fourth features 2244 in the fourth region R4.

Referring to FIG. 9B with reference to FIG. 8, another configuration of the warpage control portion 20C is provided. For example, the pattern density of the first features 2241 in the first region R1 is denser than the pattern density of the third features 2243 in the third region R3. In some embodiments, the pattern density of the first features 2241 in the first region R1 is also denser than the pattern density of the fourth features 2244 in the fourth region R4. In some embodiments, the pattern densities of the third features 2243 and the fourth features 2244 are substantially the same. Alternatively, the pattern density of the third features 2243 in the third region R3 may be denser or sparser than that of the fourth features 2244 in the fourth region R4. In other embodiments, the pattern density of the first features 2241 in the first region R1 is between the pattern density of the third features 2243 and the pattern density of the fourth features 2244. For example, the pattern density of the first features 2241 in the first region R1 is denser than the pattern density of the third features 2243 in the third region R3, but sparser than the pattern density of the fourth features 2244 in the fourth region R4. Alternatively, the pattern density of the first features 2241 in the first region R1 may be sparser than the pattern density of the third features 2243 in the third region R3, but denser than the pattern density of the fourth features 2244 in the fourth region R4.

The second features 2242 may be distributed within the second region R2 where may be a border region of the warpage control portion 20B in the top view. In some embodiments, the second features 2242' function as the alignment marks and may be disposed aside the fourth region R4 and the third region R3. For example, the second features 2242' are disposed at the middle of the periphery of the warpage control portion 20C in the top view. Although the illustrated second features 2242' are cross-shaped marks, it is understood that the second features in other embodiments may have any shape and should not limit the scope of the present disclosure. It is appreciated that the characteristics (e.g., density, dimension, shape, arrangement, etc.) of the metal pattern (224B, 224C) illustrated herein are merely examples, and may be changed if other type of IC portion is to be bonded.

Figure 10:
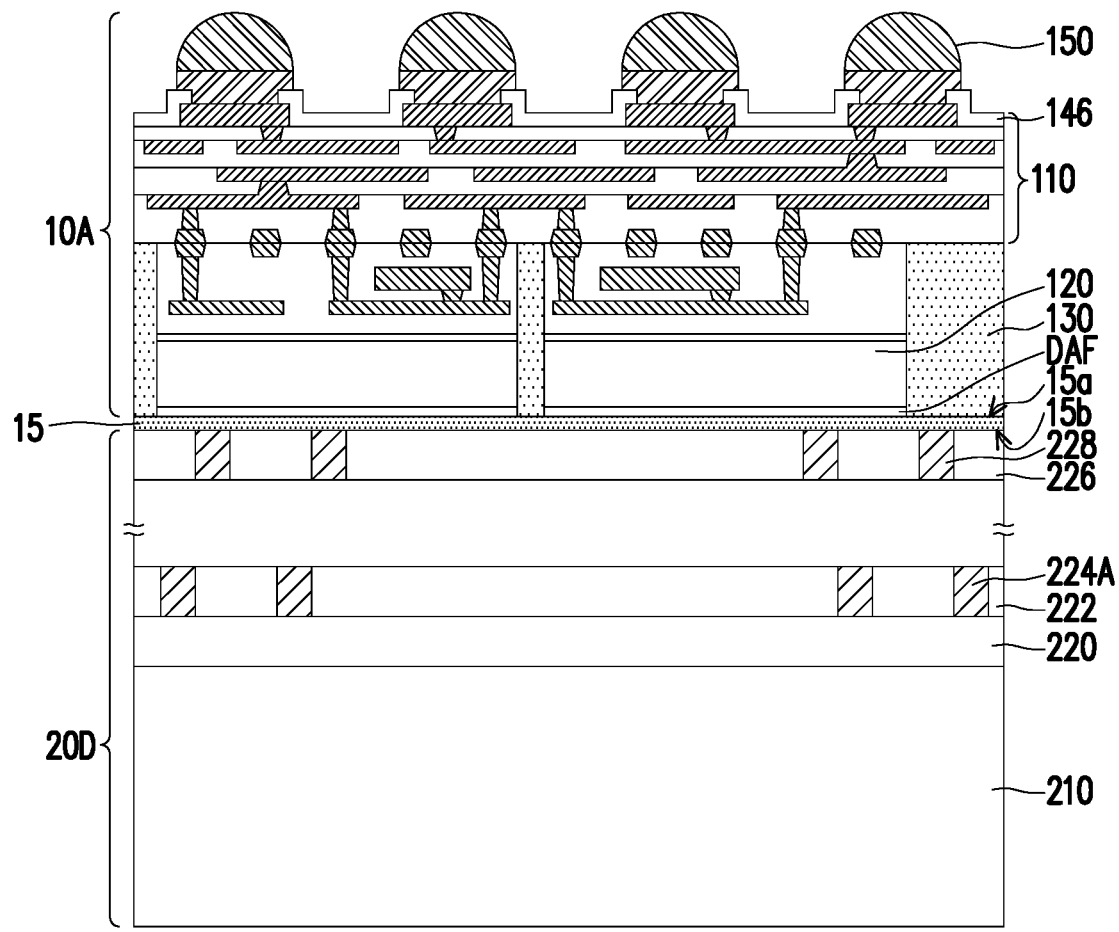
FIGS. 10-11 illustrate schematic cross-sectional views of variations of a semiconductor structure in accordance with some embodiments.
Figure 11:
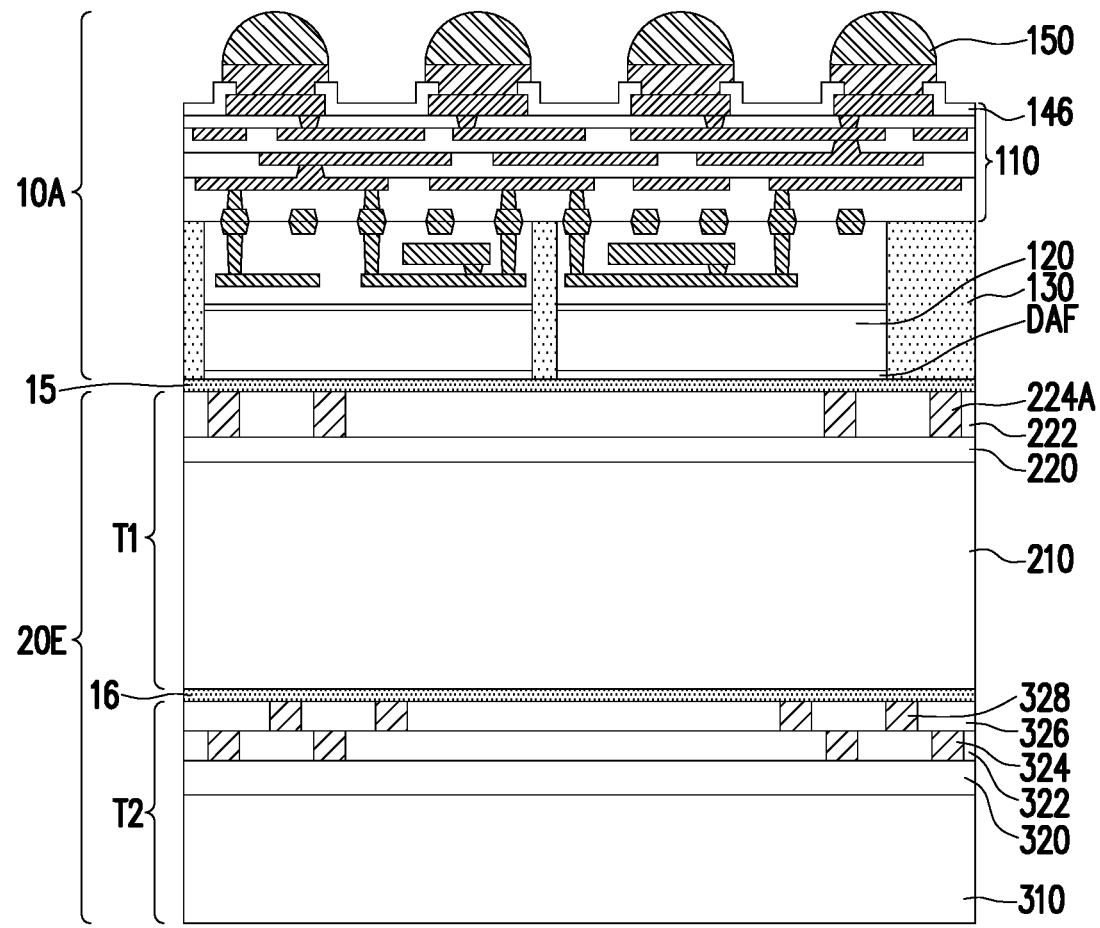

FIGS. 10-11 illustrate schematic cross-sectional views of variations of a semiconductor structure in accordance with some embodiments. Throughout the various views and illustrative embodiments of the present disclosure, like reference numbers are used to designate like elements. Referring to FIG. 10, a semiconductor structure S3 including the IC portion 10A and the warpage control portion 20D attached to the IC portion 10A. The semiconductor structure S3 may be similar to the semiconductor structure S1 described in FIG. 5, except that the warpage control portion 20D of the semiconductor structure S3 includes a plurality of metal patterns stacked upon one another. For example, after forming the metal pattern 224A in the second dielectric layer 222 as described in FIG. 4B, additional dielectric layer(s) 226 and additional metal pattern(s) 228 are subsequently formed over the dielectric layer 222 and the metal pattern 224A. The forming processes of the additional dielectric layer(s) 226 and the additional metal pattern(s) 228 may be similar to the forming processes of the second dielectric layer 222 and the metal pattern 224A, so the detailed descriptions are omitted for the sake of brevity. For example, as the number of dielectric layers and metal pattern formed over the substrate 210 increase, the bending forces provided by these layers result in significant warpage of the warpage control portion 20D. The numbers of the additional dielectric layer(s) 226 and the additional metal pattern(s) 228 are dependent upon the designs of the warpage control portion 20D and the IC portion 10A that is to be bonded.

In some embodiments, the pattern distribution of the additional metal pattern(s) 228 may be different from that of the underlying metal pattern 224A. In some other embodiments, the additional metal pattern(s) 228 has a pattern distribution similar or same as the pattern distribution of the underlying metal pattern 224A. Any combination of pattern distribution types for the various metal patterns may be used. The additional metal pattern(s) 228 may be or may not be in physical contact with the underlying metal pattern 224A. In some embodiments, the additional metal pattern(s) 228 and the underlying metal pattern 224A are staggered from one another. For example, the metal pattern 224A and the additional metal pattern(s) 228 are electrically isolated from one another. The thickness of the additional dielectric layer (s) 226 may be adjusted to exert the appropriate amount of counteracting stress. In some embodiments, the metal pattern 224A is replaced with the metal pattern 224B or 224C as described in conjunction with FIGS. 8 and 9A-9B. In some embodiments, the IC portion 10A is replaced with the IC portion 10B as illustrated in conjunction with FIG. 8. It is appreciated that the IC portion may be replaced with other types of device (e.g., system on integrated circuit (SoIC) devices, system on a chip (SoC), package structure, or the like).

Referring to FIG. 11, a semiconductor structure S4 including the IC portion 10A and the warpage control portion 20E attached to the IC portion 10A. The semiconductor structure S4 may be similar to the semiconductor structure S3 described in FIG. 5, except for the configuration of the warpage control portion 20E. For example, the warpage control portion 20E includes a first tier T1 and a second tier T2 bonded to the first tier T1. The configuration of the first tier T1 may be similar to that of the warpage control portion 20A described in FIG. 4B. The second tier T2 may be bonded to the first tier T1 opposite to the IC portion 10A. The bonding of the first tier T1 and the second tier T2 may include adhesive bonding, fusion bonding via oxide-to-oxide bond, bonding by a glue medium such as benzocyclobutene (BCB), and the like. In some embodiments, the second tier T2 is bonded to the substrate 210 of the first tier T1 via a bonding layer 16. The material of the bonding layer 16 may be similar to the material of the bonding layer 15, and the detailed descriptions are not repeated for the sake of brevity.

The second tier T2 may include a substrate 310, a first dielectric layer 320 formed on the substrate 310, a second dielectric layer 322 formed on the first dielectric layer 320, a first metal pattern 324 embedded in the second dielectric layer 322, a third dielectric layer 326 formed on the second dielectric layer 322, and a second metal pattern 328 embedded in the third dielectric layer 326. The substrate 310 may be similar to the substrate 210. In some embodiments, the substrate 210 of the first tier T1 and the substrate 310 of the second tier T2 are of different materials. In some embodiments, the substrate 210 and the substrate 310 may have different thicknesses. The substrate 210 may be thicker or thinner than the substrate 310, and the thicknesses of the substrates may depend on the warpage to be compensated for. The stack of dielectric layers (e.g., 320, 322, and 326) as well as the bonding layer 16 may be interposed between the substrate 210 of the first tier T1 and the substrate 310 of the second tier T2. The materials and the thicknesses of the stack of dielectric layers (e.g., 320, 322, and 326) as well as the bonding layer 16 may be changed based on warpage design requirements. The first metal pattern 324 may be similar to the metal pattern (224A, 224B, or 224C). The second metal pattern 328 may be similar to the additional metal pattern 228. In some embodiments, the configuration of the second tier T2 may be similar to that of the warpage control portion 20D described in FIG. 10. Other configuration(s) may be used as long as the warpage control portion 20E exerts the appropriate amount of counteracting stress.

Figure 12:
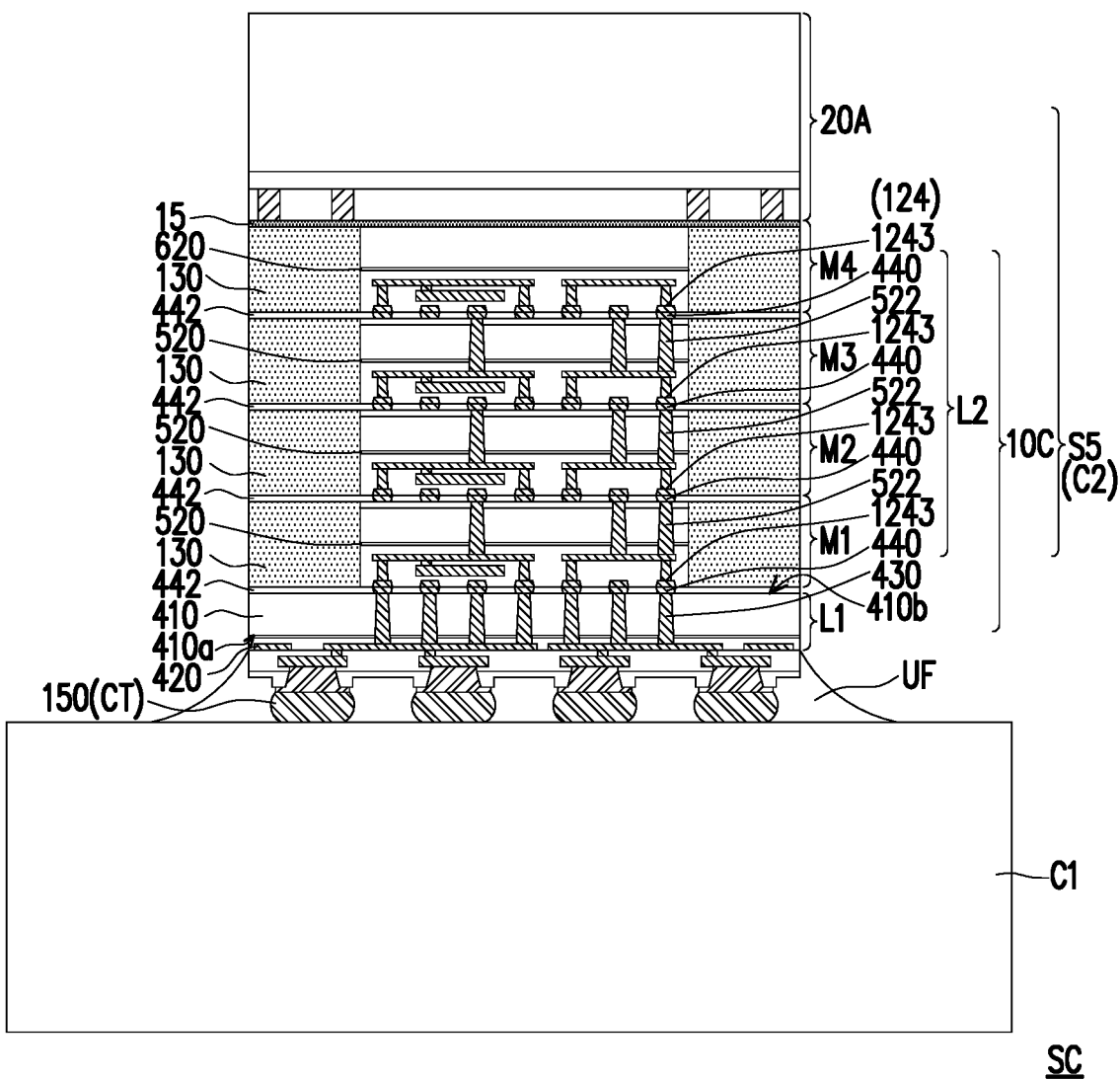
FIG. 12 illustrates a schematic cross-sectional view of an application of a semiconductor structure in accordance with some embodiments.

FIG. 12 illustrate a schematic cross-sectional view of an application of a semiconductor structure in accordance with some embodiments. Referring to FIG. 12, a component assembly SC including a first component C1 and a second component C2 disposed over the first component C1 is provided. The first component C1 may be or may include an interposer, a package substrate, a printed circuit board (PCB), a printed wiring board, and/or other carrier that is capable of carrying integrated circuits. The second component C2 may be or may include a semiconductor structure S5.

For example, the semiconductor structure S5 includes an IC portion 10C and the warpage control portion 20A attached to the IC portion 10C. In some embodiments, the IC portion 10C includes a carrier die L1 and die stack L2 stacked on and electrically connected to the carrier die L1. In some embodiments, the carrier die L1 may be configured to perform read, program, erase, and/or other operations, and the die stack L2 may be a memory stack including memory dies stacked upon one another and programmed by the carrier die L1. For example, the carrier die may be or may include a system-on-a-chip (SoC), a central processing unit (CPU), a graphics processing unit (GPU), or other types of IC components. The die stack L2 may include dynamic random access memory (DRAM) dies, static random access memory (SRAM) dies, synchronous dynamic random access memory (SDRAM) dies, NAND flash dies, or other types of IC components.

In some embodiments, the carrier die L1 includes a semiconductor substrate 410 having semiconductor devices formed thereon, a redistribution structure 420 disposed over the front side 410a of the semiconductor substrate 410 to be electrically connected to the semiconductor devices, a plurality of through substrate vias (TSVs) 430 penetrating through the semiconductor substrate 410 to be electrically connected to the redistribution structure 420, a bonding dielectric layer 442 disposed on the back side 410b of the semiconductor substrate 410, and a plurality of bonding pads 440 embedded in the bonding dielectric layer 442 and electrically connected to the TSVs 430. The conductive terminals 150 are formed on the redistribution structure 420 opposite to the semiconductor substrate 410.

The die stack L2 includes a plurality of tiers (e.g., M1-M4) stacked upon one another, where each tier may include an IC component (e.g., 520, 620) laterally covered by the insulating layer 130. The IC component in the overlying tier is in physical and electrical contact with the IC component in the underlying tier. The IC component 620 at the topmost tier M4 is attached to the warpage control portion 20A via the bonding layer 15. The IC component 620 may be similar to the IC component 120. The bottommost IC component 520 may be similar to the IC component 620 at the topmost tier M4, except that the IC component 520 includes through substrate vias (TSVs) 522. For example, the respective TSV 522 of the IC component 520 penetrates through the semiconductor substrate 122 to be in physical and electrical contact with the interconnect structure 124. In some embodiments, the bonding dielectric layer 442 is interposed between the adjacent tiers (e.g., M1 and M2, M2 and M3, or M3 and M4). A plurality of bonding pads 440 may be embedded in each of the bonding dielectric layers 442 to be physically and electrically connected to the TSVs 522 of the IC component 520 at the underlying tier and also connected to the bonding connectors 1243 of the interconnect structure 124 at the overlying tier. It is appreciated that the four-tier stack is provided for illustrative purposes, and other embodiments may utilize fewer or additional tiers in the die stack.

It is noted that the IC portion 10C and the warpage control portion 20A may be replaced with any IC portion and warpage control portion discussed above. The second component C2 mounted on the first component C1 may be similar to the semiconductor structure (e.g., S1, S2, S3, S4) described above. For example, one or more semiconductor structures described above may be electrically coupled to the first component C1 through a plurality of terminals CT. The terminals CT may be the conductive terminals 150. In the case of processing, the temperature is risen such that the terminals CT is deformed and bonded to the contact pads (not shown) of the first component C1. By using the warpage control portion, the warpage of the bonded package components (C1 and C2) may not occur. In some embodiments, an underfill layer UF is formed between the gap of the first component C1 and the second component C2 to at least laterally cover the terminals CT. Alternatively, the underfill layer UF is omitted.

In some other embodiments, the second component C2 mounted on the first component C1 may be an integrated fan-out (InFO) package including at least one semiconductor structure (e.g., S1-S5) packaged therein. For example, the second component C2 includes a plurality of semiconductor structures (e.g., any combinations of semiconductor structures S1-S5) disposed side by side and surrounding by a packaging encapsulation (not shown; e.g., a molding compound). Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

According to some embodiments, a semiconductor structure includes an integrated circuit (IC) component, an insulating layer laterally encapsulating sidewalls of the IC component, a redistribution structure disposed on the insulating layer and the IC component, and a warpage control portion coupling to a back side of the IC component opposite to the redistribution structure. The redistribution structure is electrically connected to the IC component. The warpage control portion includes a substrate, a patterned dielectric layer disposed between the substrate and the IC component, and a metal pattern embedded in the patterned dielectric layer and electrically isolated from the IC component.

According to some alternative embodiments, a semiconductor structure includes an integrated circuit (IC) portion and a warpage control portion attached to the IC portion. The IC portion includes an IC component embedded in an insulating layer and a redistribution structure disposed on the IC component and the insulating layer, where a bonding connector of the IC component is bonded to a bonding connector of the redistribution structure, and a contact area of the bonding connector of the IC component at a bonding interface of the IC component and the redistribution structure is substantially equal to a surface area of the bonding connector of the redistribution structure. The warpage control portion includes a first substrate and a first metal pattern embedded in a first dielectric layer. The first metal pattern is interposed between the first substrate and the IC portion.

According to some alternative embodiments, a manufacturing method of a semiconductor structure includes at least the following steps. An integrated circuit (IC) portion is formed and forming the IC portion includes analyzing warpage characteristics of the IC portion. A warpage control portion is formed based on the warpage characteristics of the IC portion and forming the IC portion includes forming a metal pattern in openings of a patterned dielectric layer over a substrate. The IC portion is flattened by bonding the IC portion to the warpage control portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an integrated circuit (IC) portion comprising:
an IC component embedded in an insulating layer; and
a redistribution structure disposed on the IC component and the insulating layer, wherein a bonding connector of the IC component is bonded to a bonding connector of the redistribution structure, and a contact area of the bonding connector of the IC component at a bonding interface of the IC component and the redistribution structure is substantially equal to a surface area of the bonding connector of the redistribution structure; and
a warpage control portion attached to the IC portion and comprising:
a first substrate; and
a first metal pattern embedded in a first dielectric layer and interposed between the first substrate and the IC portion, wherein the first metal pattern is electrically floating in the warpage control portion.

2. The semiconductor structure of claim 1, further comprising:
a bonding layer interposed between the warpage control portion and the IC portion.

3. The semiconductor structure of claim 1, wherein the first metal pattern is substantially leveled with the first dielectric layer.

4. The semiconductor structure of claim 1, wherein sidewalls of the redistribution structure, the insulating layer, the first substrate, and the first dielectric layer are substantially leveled with one another.

5. The semiconductor structure of claim 1, wherein the first metal pattern of the warpage control portion is located within a distribution region that overlaps an orthographic projection area of the IC component, and the first metal pattern of the warpage control portion is electrically isolated.

6. The semiconductor structure of claim 1, wherein the first metal pattern of the warpage control portion comprises:
first features and second features, wherein the first features are distributed within a distribution region that overlaps an orthographic projection area of the IC component, and the second features are distributed outside the distribution region and have a pattern distribution density denser than that of the first features.

7. The semiconductor structure of claim 1, wherein the first metal pattern of the warpage control portion comprises:
first features and second features, wherein the first features are distributed within a distribution region that overlaps an orthographic projection area of the IC component, the second features are distributed outside the distribution region and have a pattern distribution density sparser than that of the first features.

8. The semiconductor structure of claim 1, wherein the warpage control portion further comprises:
a second substrate;
a second metal pattern embedded in a second dielectric layer and interposed between the first substrate and the second substrate; and
a bonding layer coupling the second dielectric layer and the second metal pattern to the first substrate.

9. A semiconductor structure, comprising:
an integrated circuit (IC) portion comprising:
an IC component embedded in an insulating layer; and
a redistribution structure bonded to the IC component and the insulating layer, the redistribution structure being electrically connected to the IC component, wherein the redistribution structure comprises bonding connectors and a bonding dielectric layer covering the bonding connectors, and the bonding connectors and the bonding dielectric layer at a bonding surface of the redistribution structure are substantially leveled with one another;
a warpage control portion attached to the IC portion and comprising:
a supporting substrate;
a metal pattern embedded in a dielectric layer and interposed between the supporting substrate and the IC portion, wherein the metal pattern is electrically floating in the warpage control portion; and
a bonding layer overlying the dielectric layer and the metal pattern and attached to the IC portion.

10. The semiconductor structure of claim 9, wherein the metal pattern of the warpage control portion is located within a distribution region that overlaps an orthographic projection area of the IC component.

11. The semiconductor structure of claim 9, wherein sidewalls of the redistribution structure, the insulating layer, the bonding layer, the supporting substrate, and the dielectric layer are substantially leveled with one another.

12. The semiconductor structure of claim 9, wherein the metal pattern of the warpage control portion comprises:
first features and second features, wherein the first features are distributed within a distribution region that overlaps an orthographic projection area of the IC component, and the second features are distributed outside the distribution region and have a pattern distribution density different from that of the first features.

13. A semiconductor structure, comprising:
an integrated circuit (IC) portion comprising:
an IC component;
an insulating layer covering the IC component;
a redistribution structure overlying the insulating layer and the IC component, the redistribution structure being electrically connected to the IC component, wherein a contact area of a bonding connector of the IC component at a bonding interface of the IC component and the redistribution structure substantially matches a surface area of a bonding connector of the redistribution structure; and
a warpage control portion underlying the IC portion and comprising:
a supporting substrate;
a metal pattern disposed between the IC portion and the supporting substrate, the metal pattern being electrically floating in the warpage control portion; and
a patterned dielectric layer overlying the supporting substrate, and the patterned dielectric layer covering and being substantially leveled with the metal pattern.

14. The semiconductor structure of claim 13, further comprising:
a bonding layer coupling the warpage control portion to the IC portion.

15. The semiconductor structure of claim 13, wherein the warpage control portion further comprises:
an oxide layer interposed between the supporting substrate and the patterned dielectric layer.

16. The semiconductor structure of claim 13, wherein the metal pattern of the warpage control portion is located within a distribution region that underlies a region of the IC component, and the metal pattern of the warpage control portion comprises an alignment feature disposed in a border region surrounding the distribution region.

17. The semiconductor structure of claim 13, wherein at the bonding interface, the bonding connector of the IC component is bonded to the bonding connector of the redistribution structure, and a bonding dielectric layer of the IC component laterally covering the bonding connector of the IC component is bonded to a bonding dielectric layer of the redistribution structure laterally covering the bonding connector of the redistribution structure.

18. The semiconductor structure of claim 13, wherein the metal pattern of the warpage control portion comprises:
   a plurality of first features distributed within a first region that underlies a region of the IC component; and
   a plurality of second features distributed within a second region that underlies a region of the insulating layer, wherein a pattern distribution density of the plurality of first features is sparser than the plurality of second features.

19. The semiconductor structure of claim 13, wherein the metal pattern of the warpage control portion comprises:
   a plurality of first features distributed within a first region that underlies a region of the IC component; and
   a plurality of second features distributed within a second region that underlies a region of the insulating layer, wherein a pattern distribution density of the plurality of first features is denser than the plurality of second features.

20. The semiconductor structure of claim 13, wherein the warpage control portion further comprises:
   an additional supporting substrate;
   an additional patterned dielectric layer disposed between the supporting substrate and the additional supporting substrate;
   an additional metal pattern embedded in the additional patterned dielectric layer, wherein the additional metal pattern is electrically floating in the warpage control portion.

* * * * *